(12) United States Patent
Toratani et al.

(10) Patent No.: US 9,078,358 B2
(45) Date of Patent: Jul. 7, 2015

(54) ASSEMBLY STRUCTURE FOR INJECTION MOLDED SUBSTRATE AND FOR MOUNTING COMPONENT

(75) Inventors: Tomoaki Toratani, Tokyo (JP); Toshitaka Hara, Tokyo (JP); Kyutaro Abe, Tokyo (JP); Motomu Shibamura, Tokyo (JP); Kyosuke Hashimoto, Tokyo (JP)

(73) Assignees: FURUKAWA ELECTRIC CO., LTD., Tokyo (JP); FURUKAWA AUTOMOTIVE SYSTEMS, INC, Shiga (JP)

( * ) Notice: Subject to any disclaimer, the term of this patent is extended or adjusted under 35 U.S.C. 154(b) by 160 days.

(21) Appl. No.: 13/526,015

(22) Filed: Jun. 18, 2012

(65) Prior Publication Data

US 2012/0255767 A1    Oct. 11, 2012

Related U.S. Application Data

(63) Continuation of application No. PCT/JP2010/073112, filed on Dec. 22, 2010.

(30) Foreign Application Priority Data

Dec. 24, 2009   (JP) ................................ 2009-291838
Feb. 25, 2010   (JP) ................................ 2010-039869

(51) Int. Cl.
*H05K 1/16*    (2006.01)
*H05K 1/02*    (2006.01)

(52) U.S. Cl.
CPC ............ *H05K 1/0263* (2013.01); *H05K 1/0271* (2013.01); *H05K 2201/09063* (2013.01); *H05K 2201/09072* (2013.01)

(58) Field of Classification Search
USPC .......... 174/260, 255, 256, 259, 261; 361/760, 361/770; 438/106, 612; 257/676, 690, 692, 257/778
See application file for complete search history.

(56) References Cited

U.S. PATENT DOCUMENTS 5,684,677 A * 11/1997 Uchida et al. ................. 361/770
6,097,610 A *  8/2000 Hashimoto ................... 361/760

(Continued)

FOREIGN PATENT DOCUMENTS

CN    A-1926929    3/2007
EP    0 388 311 A2    9/1990

(Continued)

OTHER PUBLICATIONS

Extended European Search Report issued in European Application No. 10839444.6 dated Dec. 20, 2013.

(Continued)

*Primary Examiner* — Xiaoliang Chen
(74) *Attorney, Agent, or Firm* — Oliff PLC

(57) ABSTRACT

A substrate (1) includes conductive portions (7) formed by press working and a resin portion (11) integrally injection-molded with the conductive portions (7). The conductive portions (7) are formed from, for example, a copper alloy. The resin portion 11 is formed from, for example, PPS. A surface-mount component (3), which is an electronic surface-mount component, is mounted on the substrate (1). The surface-mount component (3) has electrodes (5) at its opposite sides, and the electrodes (5) and the respective conductive portions (7) are electrically connected by means of a solder (9). The substrate (1) has a hole (13), which functions as a stress relaxation mechanism, formed in the resin portion (11) (a portion extending therethrough) between connection portions (15) under the surface-mount component (3). The substrate (1) also has resin-exposed portions (13), which function as a stress relaxation mechanism, formed on opposite sides of the surface-mount component (3).

10 Claims, 22 Drawing Sheets

(a)

(b)

(56) References Cited

U.S. PATENT DOCUMENTS

| | | | |
|---|---|---|---|
| 6,164,983 A * | 12/2000 | Lemke et al. | 439/83 |
| 6,340,606 B1 * | 1/2002 | Hashimoto | 438/106 |
| 6,414,382 B1 * | 7/2002 | Hashimoto | 257/676 |
| 2002/0068424 A1 * | 6/2002 | Hashimoto | 438/612 |
| 2002/0125561 A1 * | 9/2002 | Hashimoto | 257/692 |
| 2005/0040542 A1 * | 2/2005 | Hashimoto | 257/778 |
| 2005/0224252 A1 * | 10/2005 | Mishiro | 174/256 |
| 2006/0202591 A1 * | 9/2006 | Inaguma et al. | 310/348 |
| 2006/0249832 A1 * | 11/2006 | Hashimoto | 257/690 |
| 2007/0175969 A1 | 8/2007 | Wada et al. | |
| 2008/0180926 A1 * | 7/2008 | Sakai | 361/760 |
| 2009/0117687 A1 * | 5/2009 | Hashimoto | 438/106 |
| 2009/0174502 A1 | 7/2009 | Kurita et al. | |

FOREIGN PATENT DOCUMENTS

| | | |
|---|---|---|
| EP | 1 496 728 A1 | 1/2005 |
| GB | 2 135 525 A | 8/1984 |
| JP | A-63-241979 | 10/1988 |
| JP | A-06-029654 | 2/1994 |
| JP | A-06-302933 | 10/1994 |
| JP | A-2000-151060 | 5/2000 |
| JP | A-2000-244077 | 9/2000 |
| JP | A-2001-210954 | 8/2001 |
| JP | A-2002-184909 | 6/2002 |
| JP | A-2002-374058 | 12/2002 |
| JP | A-2004-228364 | 8/2004 |
| JP | A-2004-311898 | 11/2004 |
| JP | A-2005-051204 | 2/2005 |
| JP | A-2008-10621 | 1/2008 |
| JP | A-2008-108881 | 5/2008 |
| JP | A-2009-141092 | 6/2009 |
| JP | A-2009-187999 | 8/2009 |

OTHER PUBLICATIONS

Apr. 2, 2013 Office Action issued in Japanese Application No. 2010-039869 (with partial translation).

Mar. 1, 2011 International Search Report issued in International Application No. PCT/JP2010/073112 (with translation).

Mar. 1, 2011 International Preliminary Report on Patentability issued in International Application No. PCT/JP2010/073112 (with translation).

May 21, 2014 Chinese Office Action issued in Chinese Patent Application No. 201080058885.0 (with English translation).

Jun. 13, 2014 Japanese Office Action issued in Japanese Patent Application No. 2010-268122 (with English translation).

* cited by examiner

Fig. 1
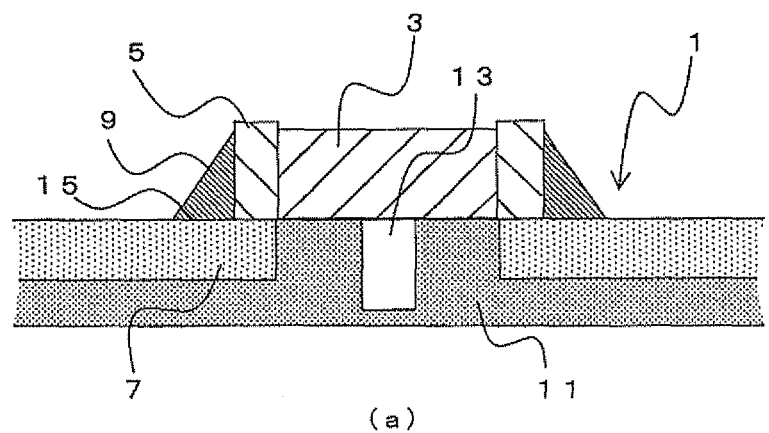
(a)
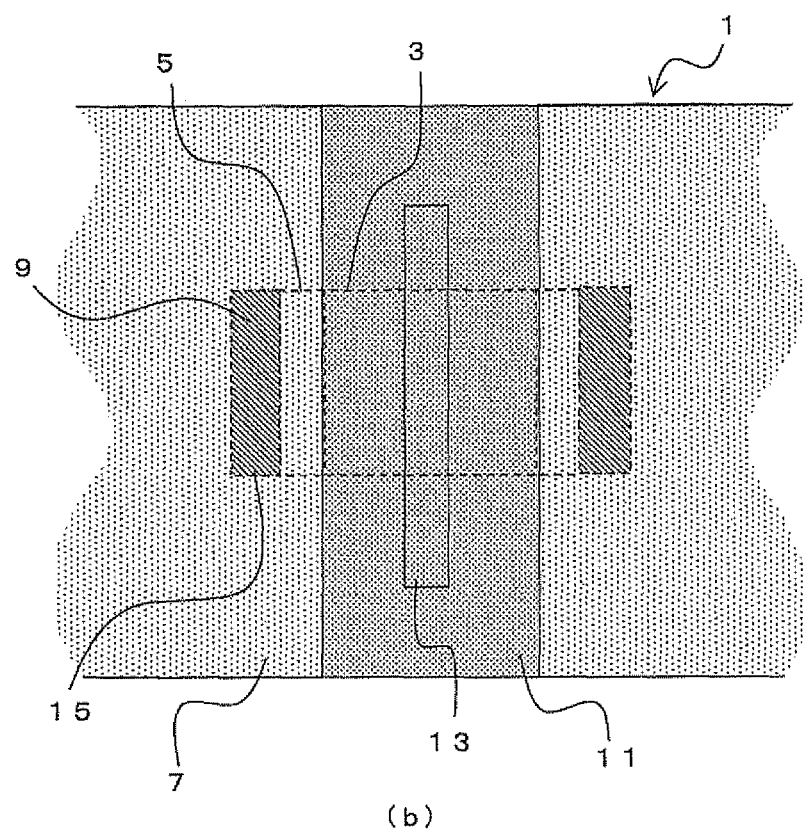
(b)

Fig. 2
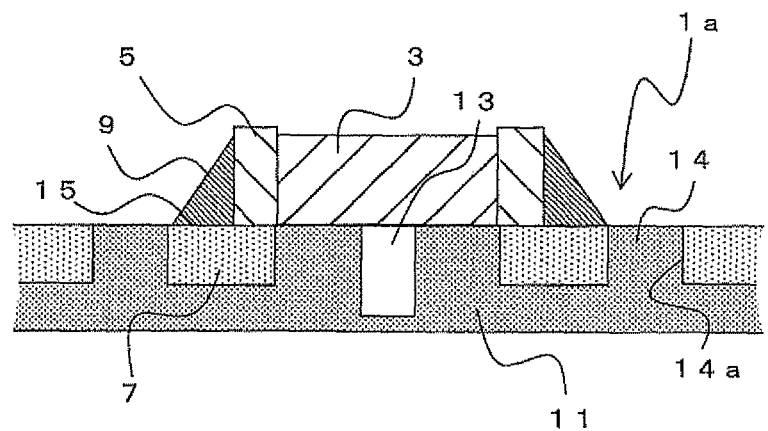
(a)
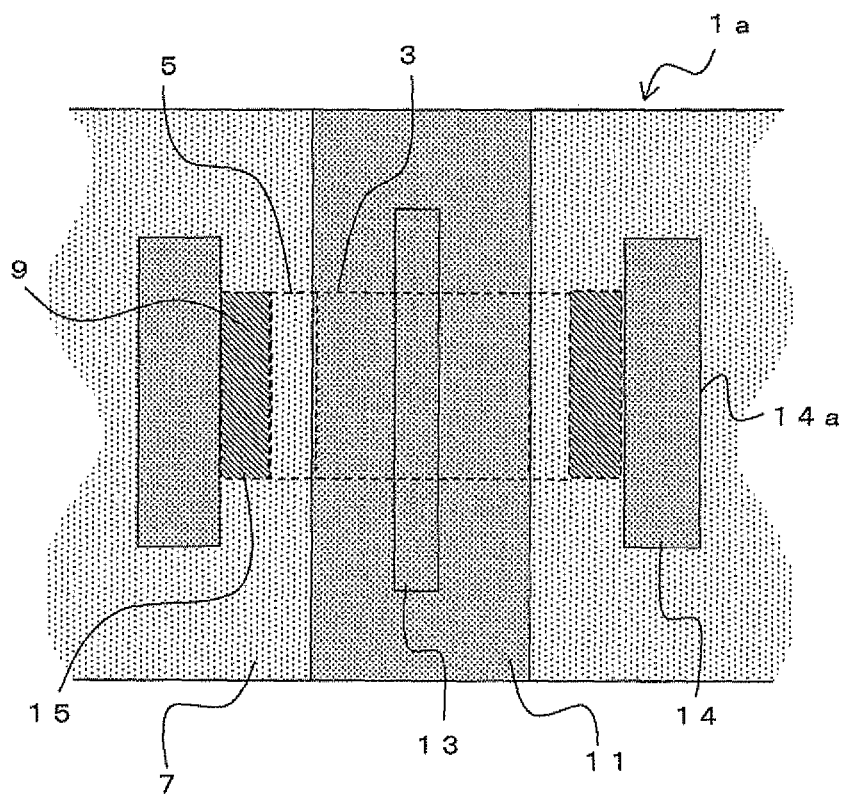
(b)

Fig. 3
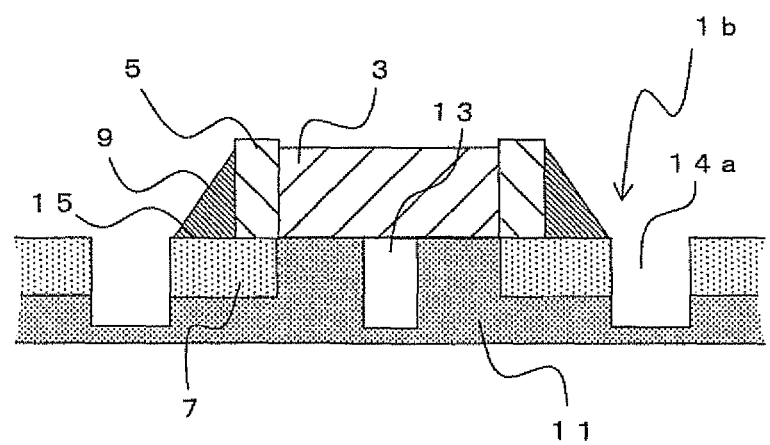
(a)
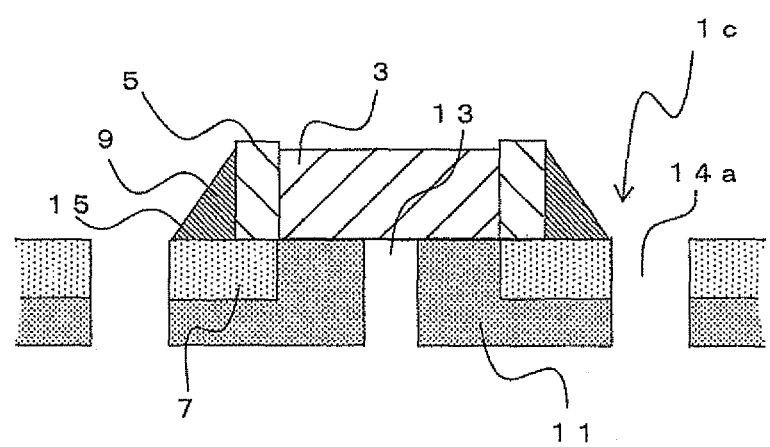
(b)

Fig. 4
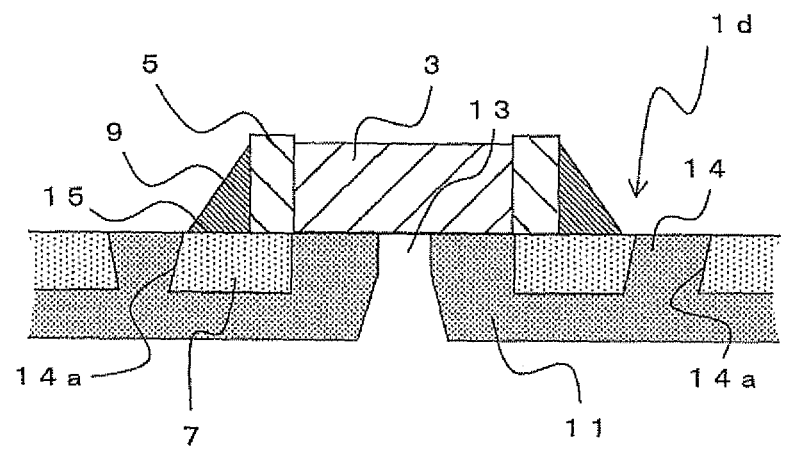
(a)
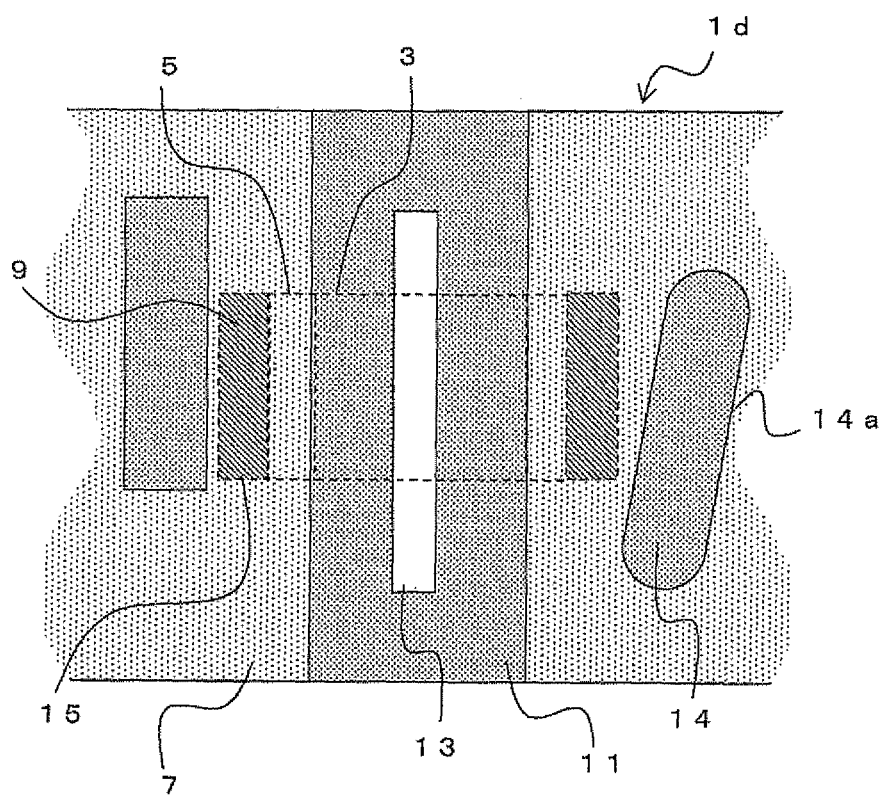
(b)

Fig. 5
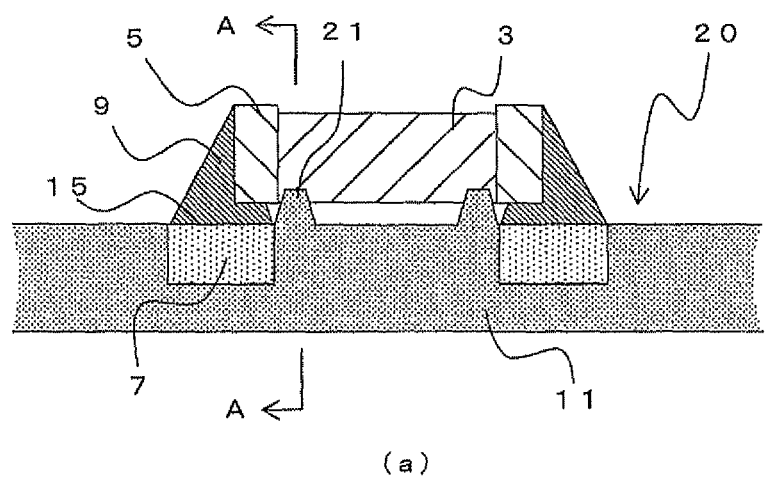
(a)
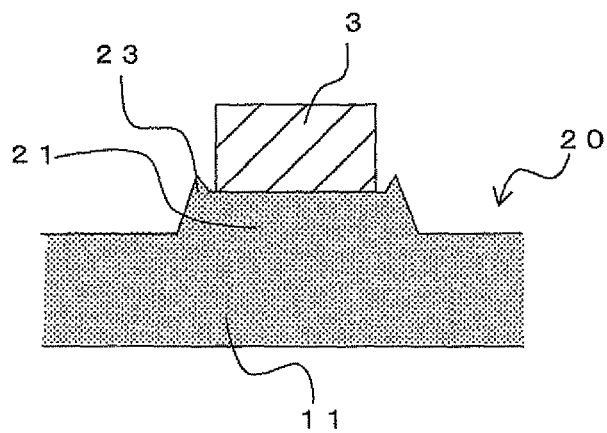
(b)

Fig. 6
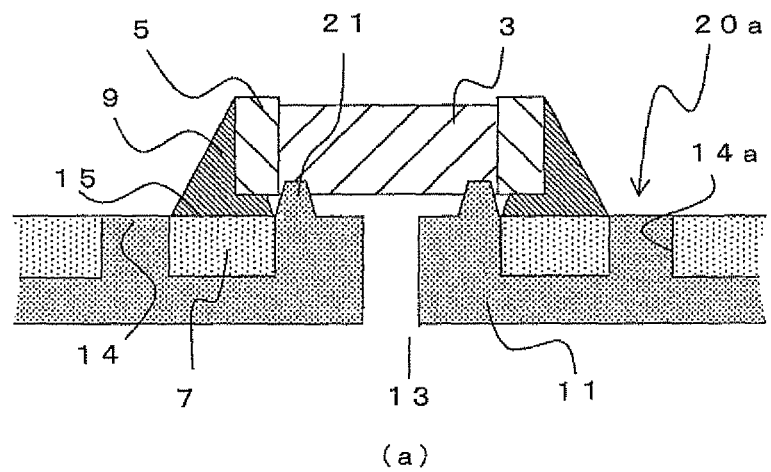
(a)
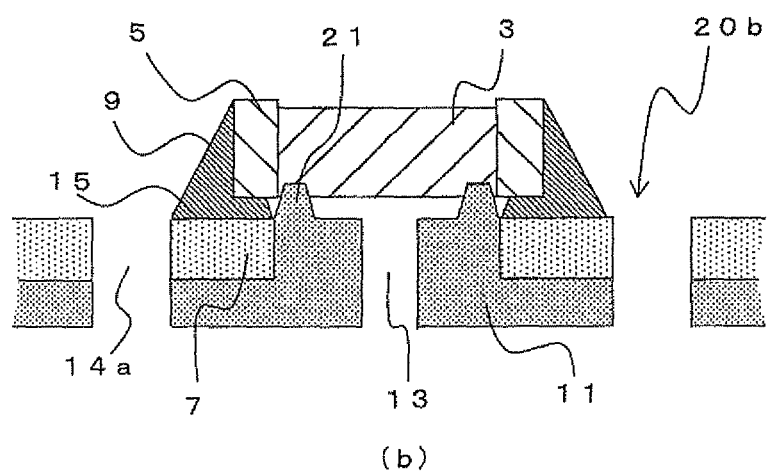
(b)

Fig. 7
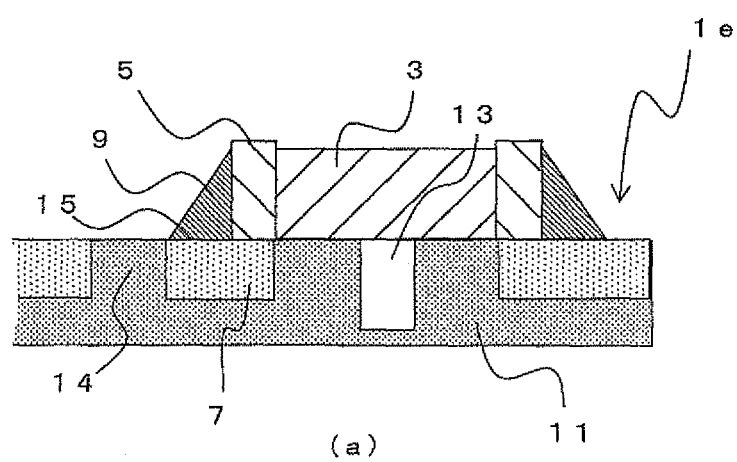
(a)
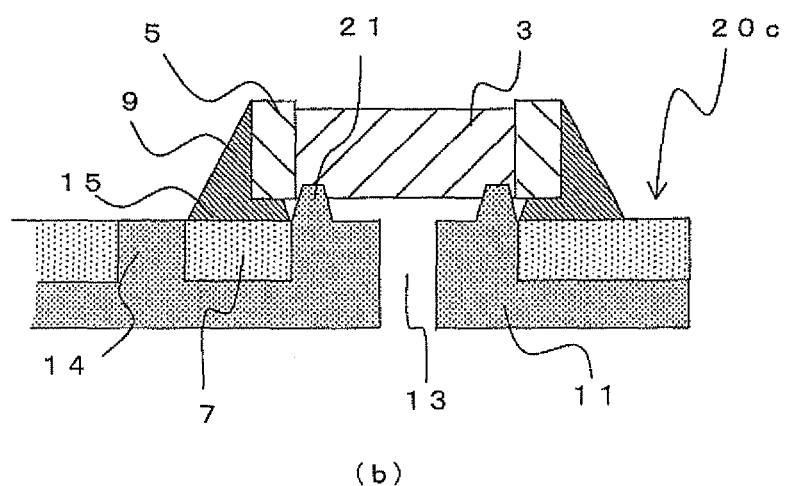
(b)

Fig. 8
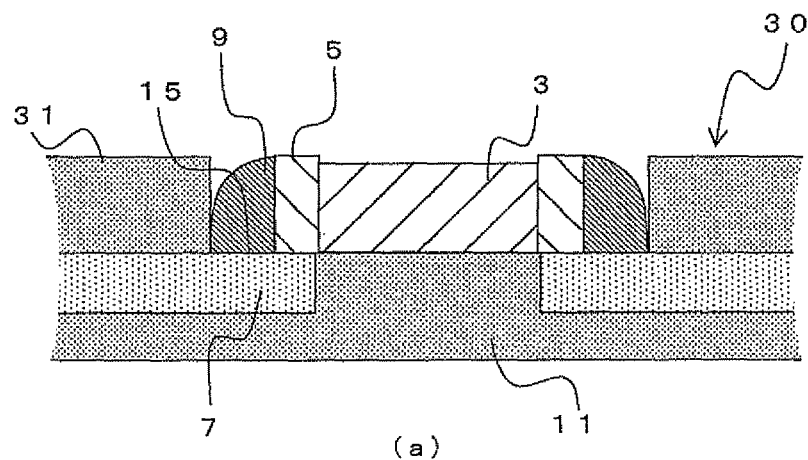
(a)
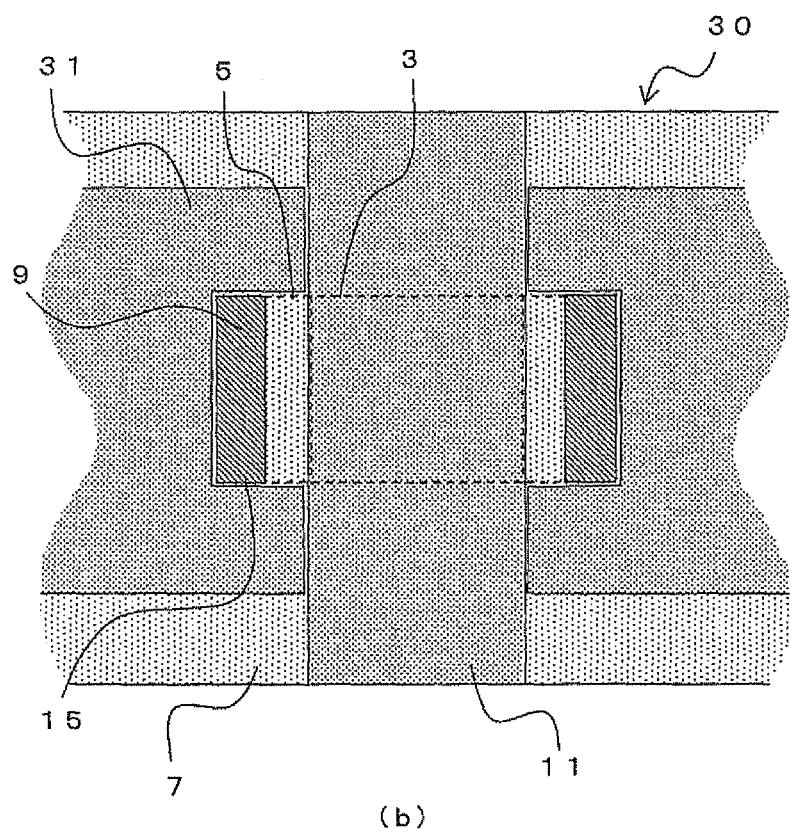
(b)

Fig. 9
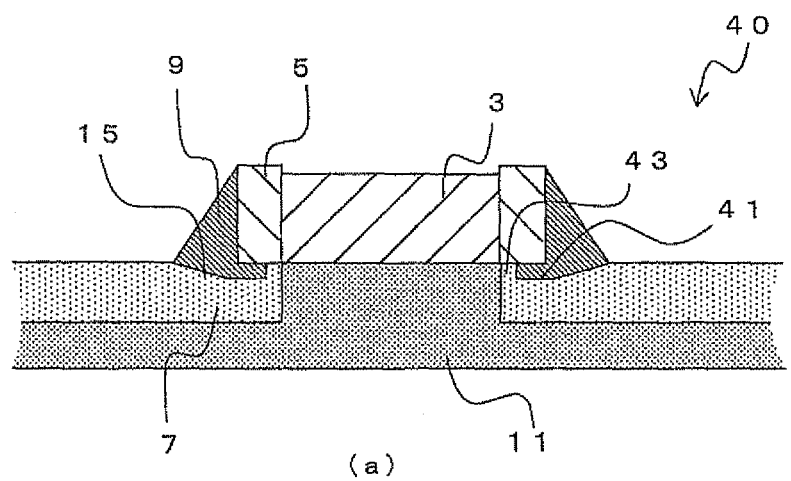
(a)
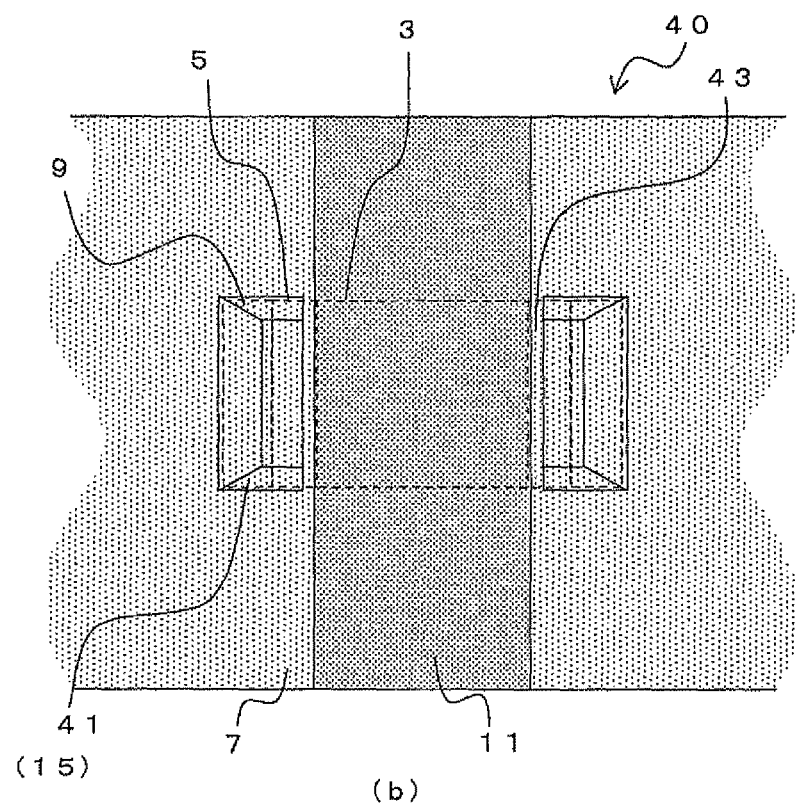
(b)

Fig. 11
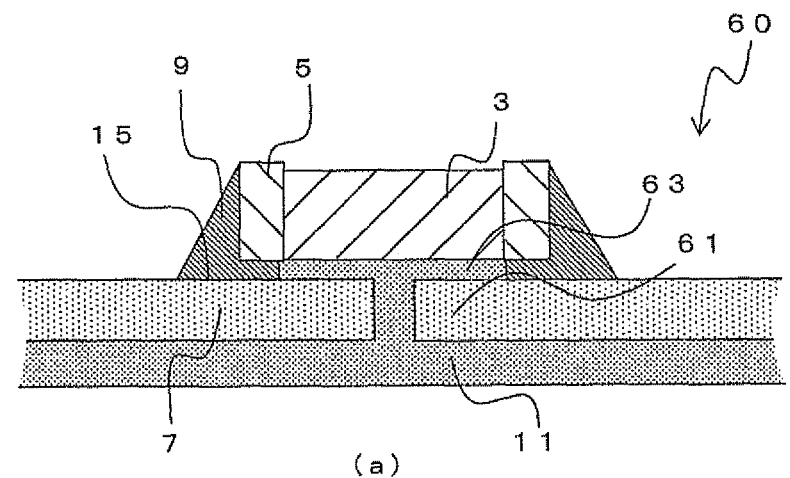
(a)
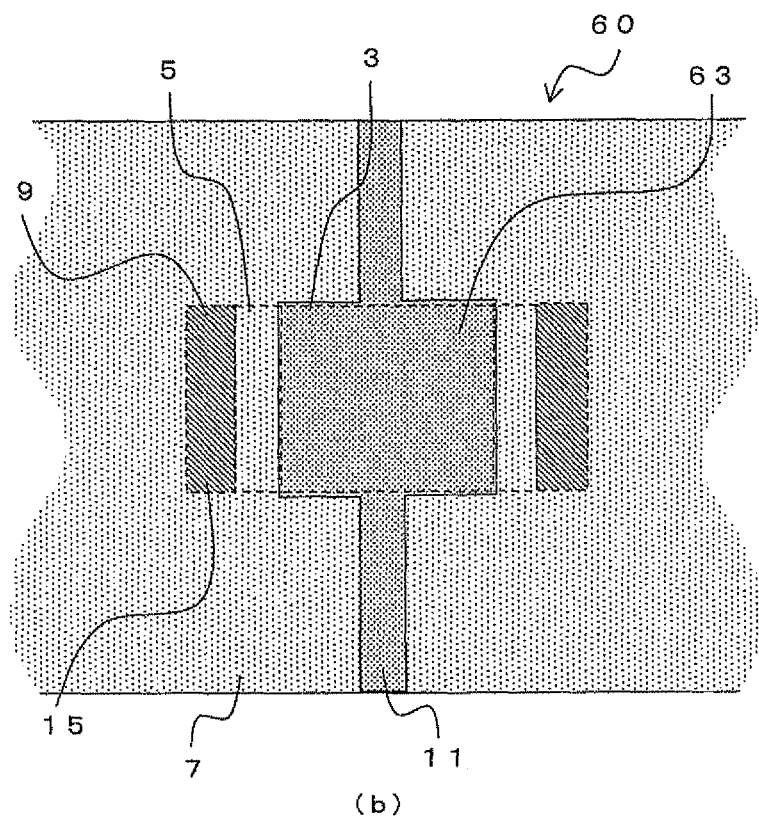
(b)

Fig. 12
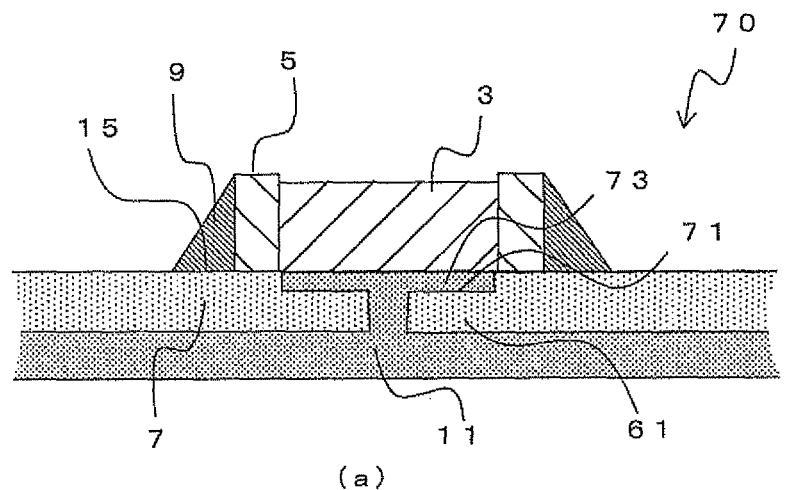
(a)
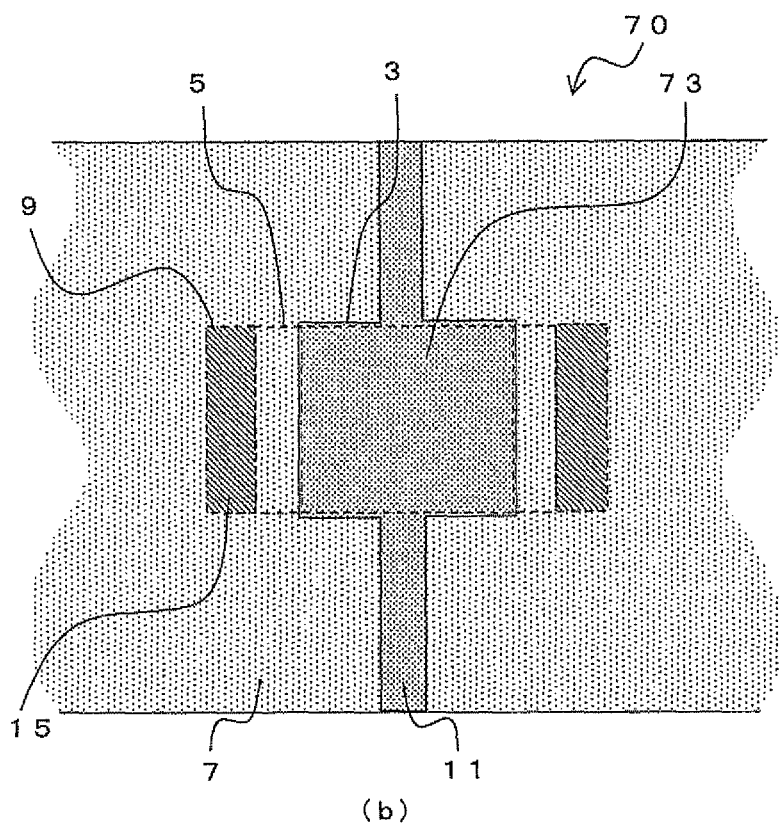
(b)

Fig. 14
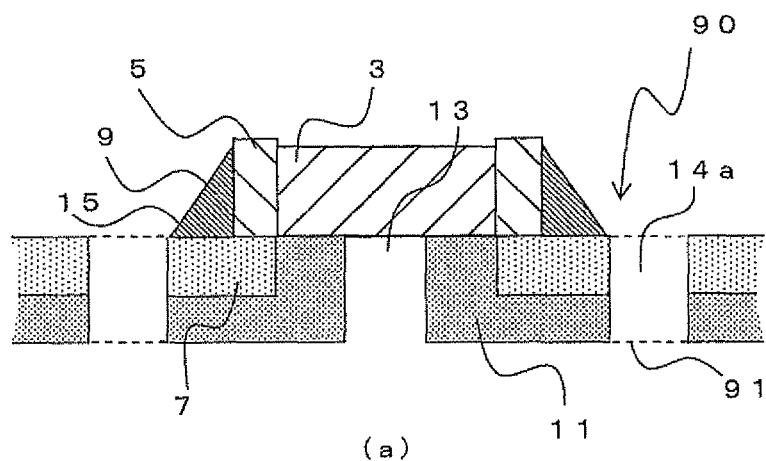
(a)
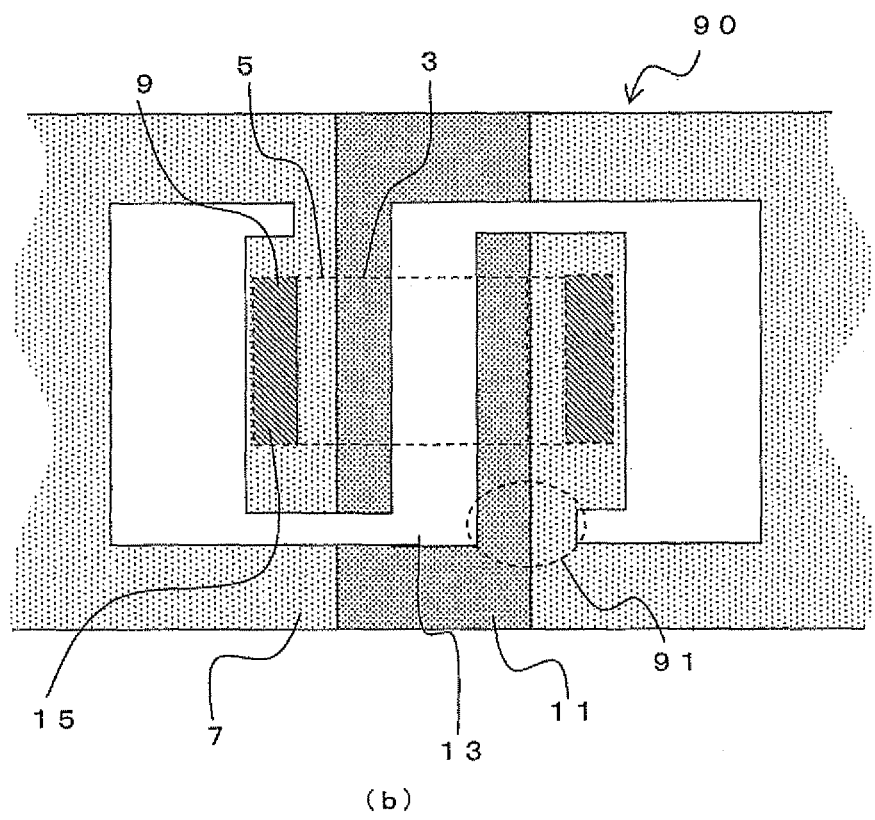
(b)

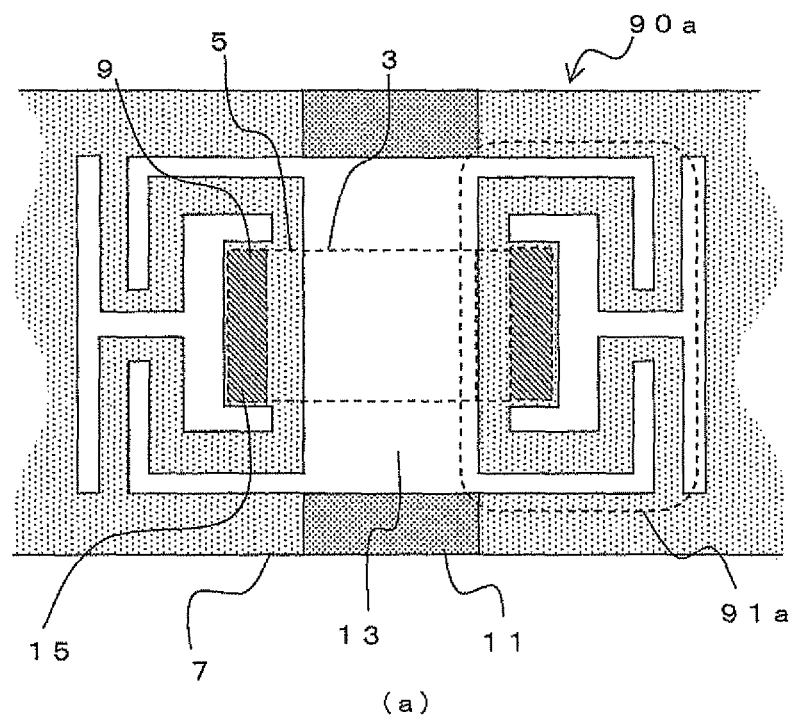
(a)
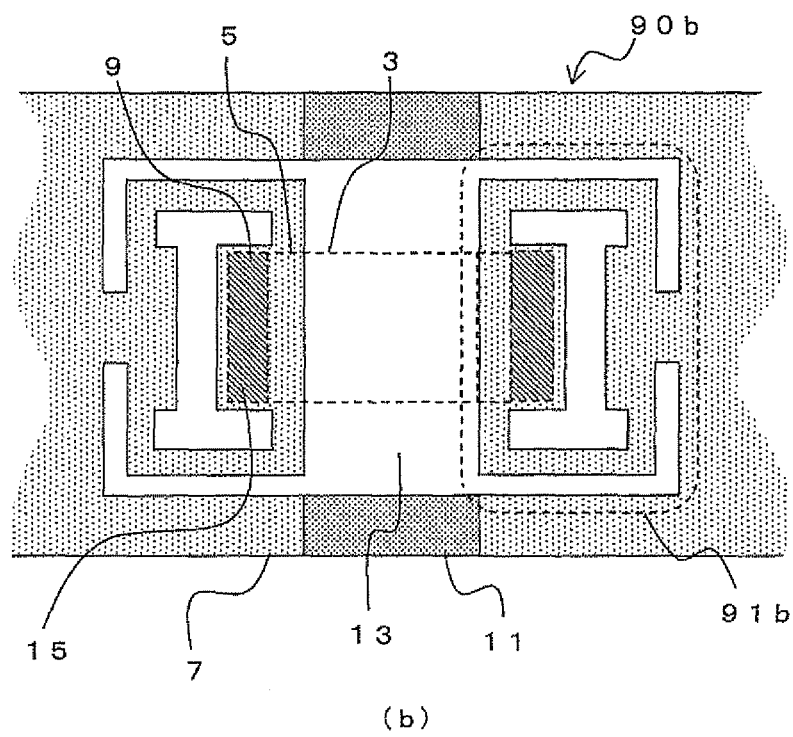
(b)
Fig. 15

Fig. 17
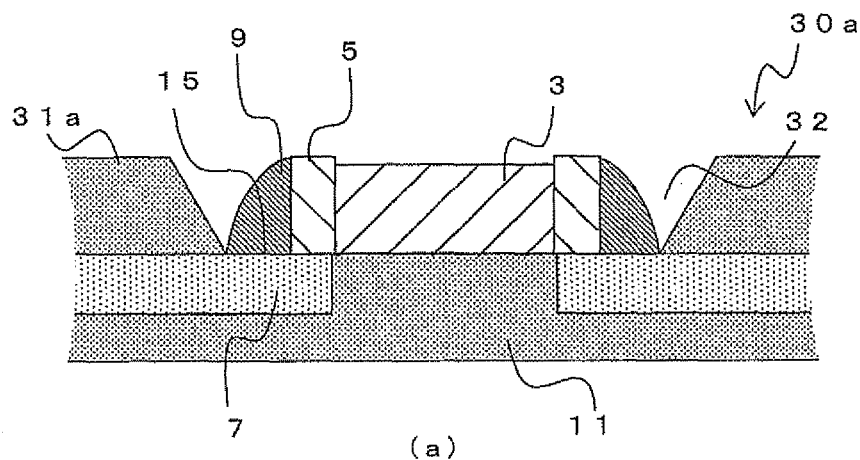
(a)
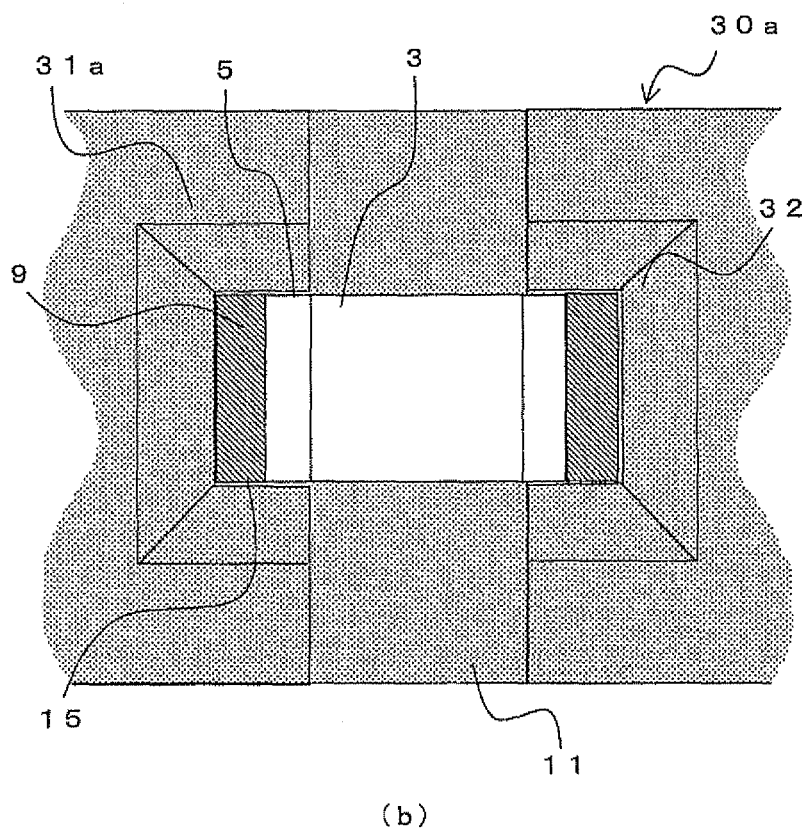
(b)

Fig. 18
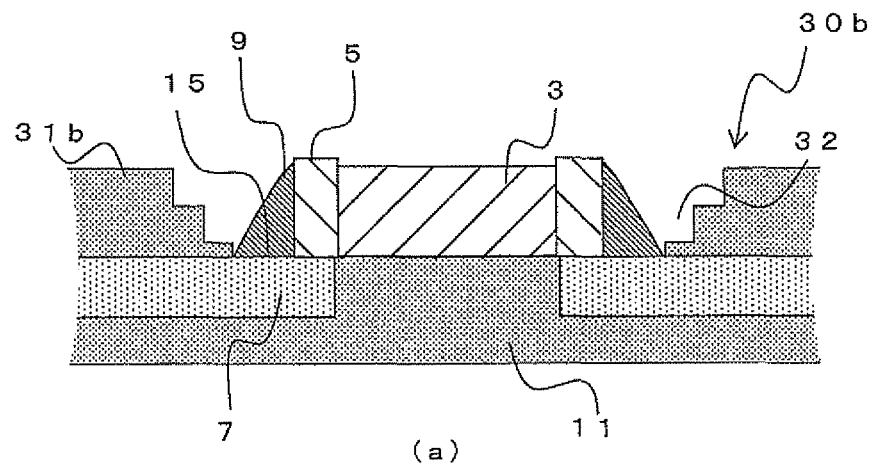
(a)
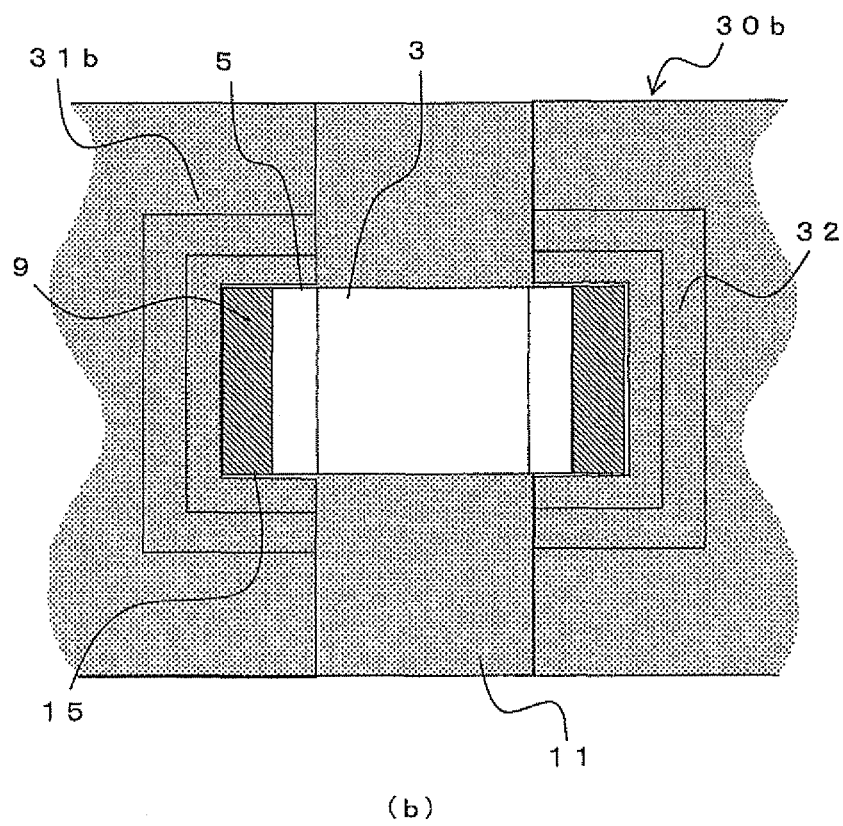
(b)

Fig. 19
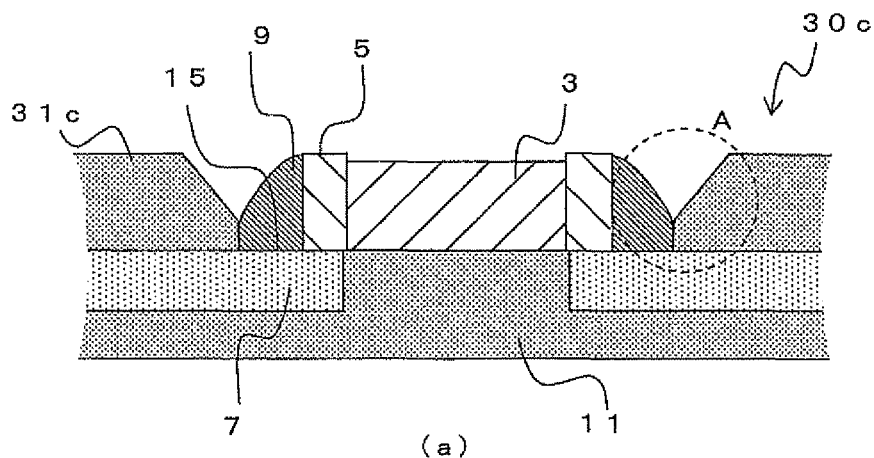
(a)
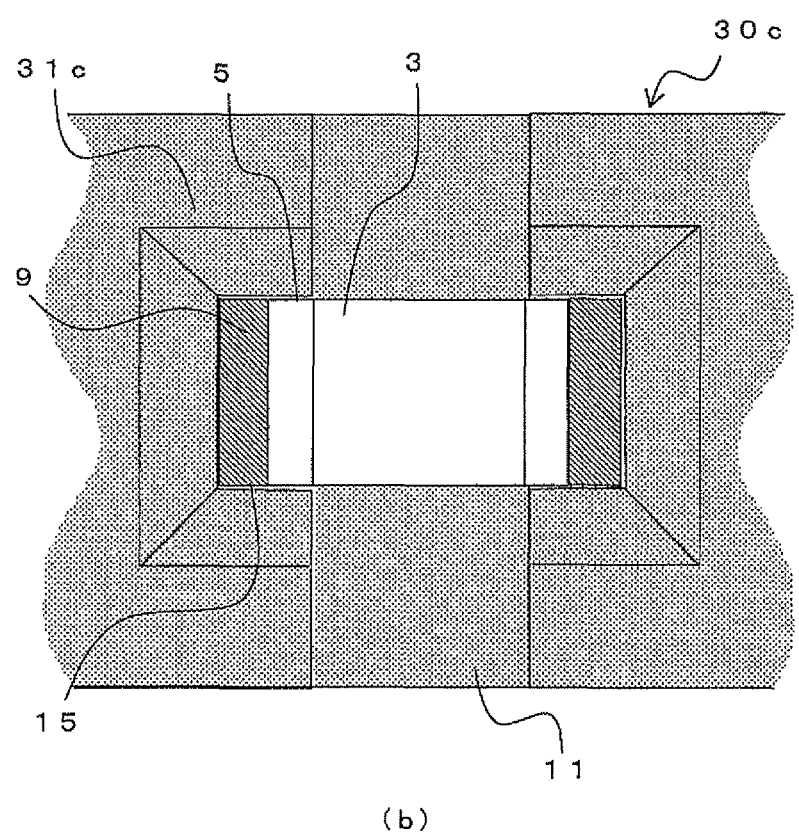
(b)

Fig. 2 1
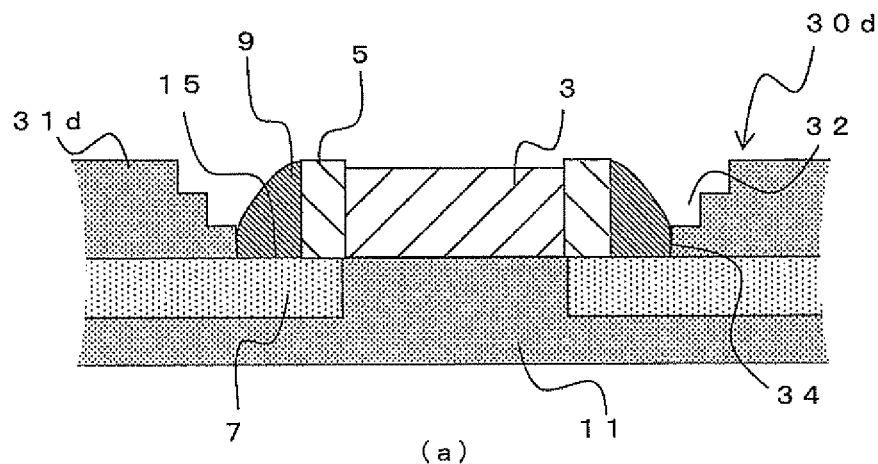
(a)
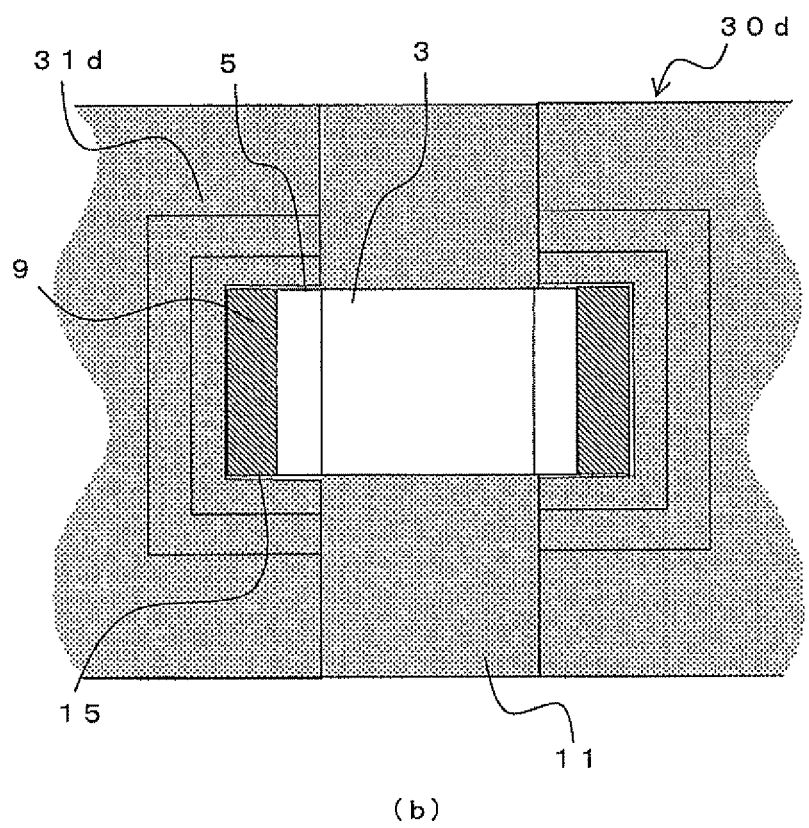
(b)

Fig. 22
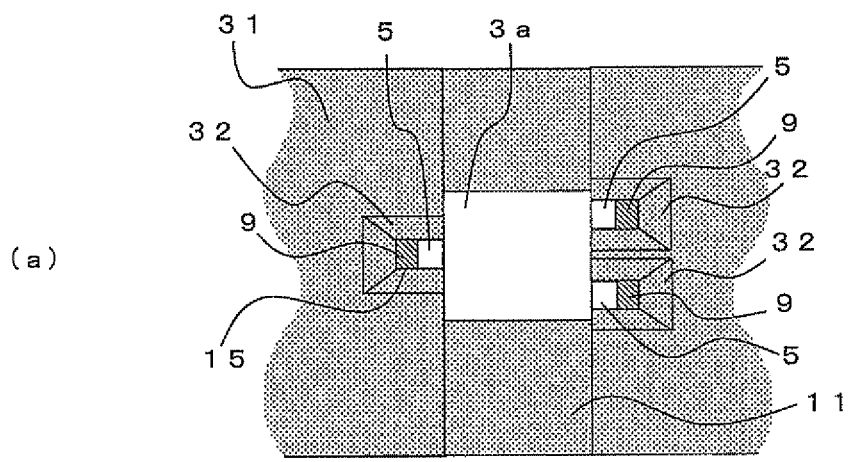
(a)
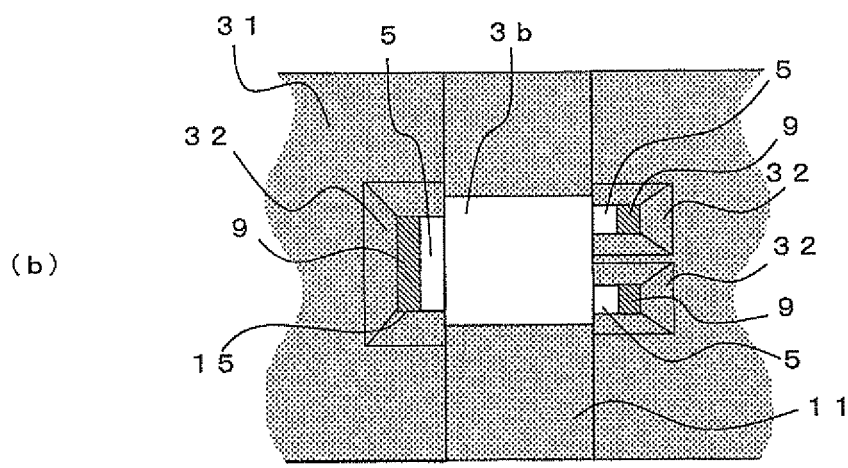
(b)
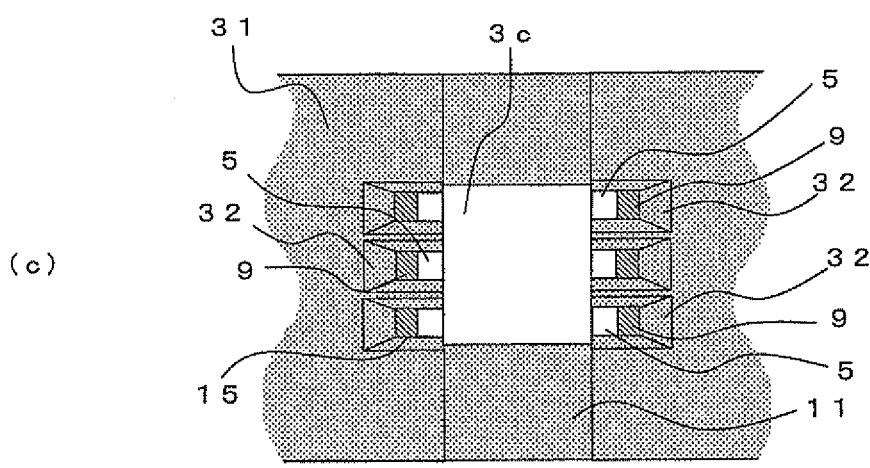
(c)

ASSEMBLY STRUCTURE FOR INJECTION MOLDED SUBSTRATE AND FOR MOUNTING COMPONENT

TECHNICAL FIELD

The present invention relates to an assembly structure for an electronic mounting component (surface-mount component) and an injection molded substrate which is formed by injection molding and on which the electronic surface-mount component is mounted.

BACKGROUND ART

Conventionally, an electronic substrate is used for mounting an electronic surface-mount component thereon. Such an electronic substrate has a conductive portion formed from a copper alloy or the like by plating, etching, etc., and an insulation portion formed from resin. The conductive portion forms a circuit, and an electronic surface-mount component is connected by soldering to the conductive portion at a predetermined position.

Such an electronic substrate on which an electronic surface-mount component is mounted is, for example, an electronic circuit unit in which the electronic surface-mount component is soldered at its bottom to the substrate, and the electronic surface-mount component and the substrate are adhered to each other by means of adhesive applied at intervals to the side surface of the substrate (refer to Patent Document 1).

PRIOR ART DOCUMENT

Patent Document

Patent Document 1: Japanese Patent Application Laid-Open (kokai) No. 2004-311898

SUMMARY OF THE INVENTION

Problems to be Solved by the Invention

Meanwhile, difficulty is encountered in using such a conventional substrate in a circuit to which a high voltage and a large current are applied, such as a DC-DC converter. This is because the cross-sectional area of a conductive portion is too small to endure such a high voltage and a large current.

A substrate to which such a high voltage and a large current are applied must use a thicker conductor (e.g., thick copper having a large cross-sectional area). A thick copper substrate allows utilization of a forming method different from that for a conventional substrate; for example, utilization of injection molding. However, such an injection molded substrate cannot use an insulation material used conventionally for a substrate, such as FR-4, but must use PPS (polyphenylene sulfide) for injection molding or the like.

The conventionally used FR-4 material has a linear expansion coefficient of 13 ppm to 21 ppm in a temperature range of −40° C. to 150° C. On the other hand, PPS material containing reinforcing fibers has a linear expansion coefficient of 20 ppm or higher at a temperature in excess of 100° C., and as high as 60 ppm at a temperature of 150° C. This is extremely high even as compared with the linear expansion coefficients of a copper alloy and solder, and at a high temperature, the thermal expansion of an insulation portion applies a large stress to solder portions through which an electronic surface-mount component is joined. Application of such stress may deteriorate reliability and service life. Particularly, in the case of employment of injection molding for forming a resin portion, since the resin portion becomes thick, the problem becomes more serious.

Also, solder joints are formed at connection portions between a substrate and a surface-mount component. In order to confine application of solder to a predetermined range for forming lands, resin or the like must be placed around the connection portions. However, in the case where the resin portion is formed by injection molding, the resin portion becomes thick. Thus, solder connection portions are enclosed by the resin or the like, and the connection between the solder and the connection portions cannot be visually checked. Accordingly, it is difficult to judge the quality, form, etc., of solder joints.

The present invention has been conceived in view of the above problem, and an object of the invention is to provide a mounting structure for an injection molded substrate and a surface-mount component which can restrain stress to be applied, as a result of thermal expansion of a resin portion, to solder used to join the substrate and the component.

Means for Solving the Problems

In order to achieve the above object, a first invention provides a mounting structure for an injection molded substrate and a surface-mount component, characterized in that the substrate comprises a resin portion, and conductive portions exposed at portions of a surface of the substrate; opposite side portions of the surface-mount component are connected to a pair of the respective conductive portions at respective connection portions by means of solder; and a stress relaxation mechanism is provided at least under the surface-mount component so as to relax stress to be applied to the solder as a result of thermal expansion of the resin portion.

The stress relaxation mechanism may include a first hole provided between the connection portions under the surface-mount component.

The stress relaxation mechanism may include a second hole formed in the corresponding conductive portion at a position located laterally of at least one of the connection portions. The second hole may be filled with resin.

The first hole and/or the second hole may be a through-hole extending through the substrate. At least a portion of a side surface of the first hole and/or the second hole may be formed obliquely, rather than perpendicularly, relative to the substrate. The side surface of the hole is a surface which extends in a front-back direction of the substrate and connects the front end and the back end of the hole.

Deformable portions may be formed around the respective connection portions, and the surface-mount component may be connected to the substrate via the deformable portions.

The stress relaxation mechanism may include projections of the conductive portions, which projections project toward a position corresponding to the center of the surface-mount component in a region under the surface-mount component between the connection portions of the surface-mount component and the conductive portions, and a resin coating which covers upper surfaces of the projections, and the resin coating may be formed at least in a region under the surface-mount component. In this case, the projections may have respective stepped portions formed in the conductive portions, and the resin coating may cover the stepped portions.

The projections may have respective stepped portions formed in the conductive portions, and the resin coating may cover the stepped portions.

According to the first invention, since the stress relaxation structure is provided between the connection portions of the electronic surface-mount component and the conductive portions on the substrate, or laterally of the electronic surface-mount component, for relaxing stress to be applied to the solder as a result of thermal expansion of the resin portion, stress to be applied to the solder at a high temperature is relaxed, thereby preventing deterioration in reliability or a like problem which could otherwise result from the application of stress.

The stress relaxation mechanism is a structure which is formed on the substrate and implemented through the shape and arrangement of the resin portion, the conductive portions, etc., for reducing the amount of thermal expansion of the resin portion, making it difficult for thermal expansion of the resin portion to affect the solder, and enabling the solder itself to endure stress. The hole is formed in the conductive portions or the resin portion and encompasses a hole having a predetermined depth from the surface and a hole extending therethrough. The hole also encompasses a hole formed in the conductive portions and filled with resin.

By means of the stress relaxation mechanism being implemented in the form of the hole provided under the surface-mount component between the connection portions of the surface-mount component and the conductive portions, the hole absorbs expansion of resin and thus can restrain application of force in such a direction as to increase the distance between the connection portions. Also, provision of the hole reduces the volume of the resin portion. Thus, the amount of expansion of the resin portion can be reduced. Furthermore, by means of formation of the holes or the holes filled with resin and having the resin exposed (exposed on a side toward the electronic surface-mount component), at positions located laterally of the electronic surface-mount component (externally of the connection portions), the holes and the expansion of the exposed resin apply force inward of the connection portions (toward a region under the electronic surface-mount component), thereby cancelling force applied in such a direction as to increase the distance between the connection portions.

Also, by means of the side surface of the hole having a portion formed obliquely, rather than perpendicularly, relative to the substrate, excellent adhesion is established between the conductive portions and the resin portion of the substrate, and the resin portion which fills the hole can function as the stress relaxation mechanism.

Also, through employment of the configuration in which the deformable portions are formed around the respective connection portions, and the surface-mount component is connected to the substrate via the deformable portions, stress associated with deformation on the substrate side is not applied directly to the connection portions. Therefore, stress to be applied to the solder at the connection portions can be reduced.

Also, through employment of the configuration in which projections of the conductive portions project toward a position corresponding to the center of the surface-mount component in a region under the surface-mount component between the connection portions of the surface-mount component and the conductive portions, and the resin coating covers the upper surfaces of the projections, the amount of resin under the electronic surface-mount component can be reduced. That is, the amount of expansion of the resin portion under the electronic surface-mount component can be reduced. Also, since the surfaces of the projections are covered with resin, there can be prevented a short circuit between the connection portions which could otherwise result from solder sneaking under the electronic surface-mount component.

Also, by means of the projections having a stepped shape, since the amount of resin under the electronic surface-mount component can be reduced, and the electronic surface-mount component and the substrate surface come into contact with each other, solder can be restrained from sneaking under the electronic surface-mount component.

A second invention provides a mounting structure for an injection molded substrate and a surface-mount component, characterized in that the substrate comprises a resin portion, and conductive portions exposed at portions of a surface of the substrate; opposite side portions of the surface-mount component are connected to a pair of the respective conductive portions at respective connection portions by means of solder; and a stress relaxation mechanism is provided at least partially under or around the solder so as to relax stress to be applied to the solder as a result of thermal expansion of the resin portion.

The stress relaxation mechanism may include protrusions provided between the connection portions under the surface-mount component; the surface-mount component may be disposed on the protrusions; and the surface-mount component may be disposed at a height higher than the surface of the substrate.

The stress relaxation mechanism may include enclosures made of resin and provided laterally of the respective connection portions, and the solder may be applied in spaces between the surface-mount component and the enclosures. Desirably, each enclosure has a solder view portion formed such that the distance between the enclosure and the surface-mount component increases with the distance from the surface of the substrate. At least a portion of each solder view portion may have a taper shape such that the distance between the enclosure and the surface-mount component increases with the distance from the surface of the substrate. At least a portion of each solder view portion may have a stepped shape such that the distance between the enclosure and the surface-mount component increases with the distance from the surface of the substrate. A solder retaining portion substantially perpendicular, to the surface of the substrate may be formed below each of the solder view portions.

The stress relaxation mechanism may include recesses formed in surfaces of the conductive portions at the connection portions; component supports may be formed under the surface-mount component; and the solder may fill the recesses.

According to the second invention, since the stress relaxation structure is provided between the connection portions of the electronic surface-mount component and the conductive portions on the substrate, or laterally of the electronic surface-mount component, for relaxing stress to be applied to the solder as a result of thermal expansion of the resin portion, stress to be applied to the solder at a high temperature is relaxed, thereby preventing deterioration in reliability or a like problem which could otherwise result from the application of stress.

Also, by means of the stress relaxation mechanism being implemented in the form of the protrusions provided under the surface-mount component between the connection portions of the surface-mount component and the conductive portions, and the surface-mount component being disposed on the protrusions, the mounting height of the electronic surface-mount component relative to the substrate is increased; thus, the distance between the electrodes of the electronic surface-mount component and the substrate surface can be increased. Therefore, the volume (height) of solder at solder joints can be increased. Accordingly, the deformability of the solder itself can be enhanced, whereby stress concentration at a portion of the solder can be reduced.

Also, by means of the stress relaxation mechanism being implemented in the form of the enclosures made of resin and provided laterally of the respective connection portions (the electronic surface-mount component), and the solder being applied in spaces between the enclosures and the electronic surface-mount component (the electrodes thereof), the shape of solder can be improved, and the volume of solder can be increased. Therefore, stress concentration at a portion of the solder can be reduced. Also, since the connection portions of the surface-mount component and the conductive portions on the substrate are readily visible, the condition of the solder can be verified. Therefore, reliability in connection between the substrate and the surface-mount component can be ensured.

Also, by means of the stress relaxation mechanism being implemented in the form of the recesses formed in the surfaces of the conductive portions at the connection portions, and the component supports being formed under the surface-mount component, the solder can fill the recesses. Therefore, the volume (height) of solder at solder joints can be increased. Accordingly, the deformability of the solder itself can be enhanced, whereby stress concentration at a portion of the solder can be reduced.

EFFECTS OF THE INVENTION

The present invention can provide a mounting structure for an injection molded substrate and a surface-mount component which can restrain stress to be applied, as a result of thermal expansion of a resin portion, to solder used to join the substrate and the component.

BRIEF DESCRIPTION OF THE DRAWINGS

FIG. 1 is a pair of views showing a substrate 1, wherein FIG. 1(a) is an elevational view, and FIG. 1(b) is a plan view.

FIG. 2 is a pair of views showing a substrate 1a, wherein FIG. 2(a) is an elevational view, and FIG. 2(b) is a plan view.

FIG. 3(a) is an elevational view showing a substrate 1b, and FIG. 3(b) is an elevational view showing a substrate 1c.

FIG. 4 is a pair of views showing a substrate 1d, wherein FIG. 4(a) is an elevational view, and FIG. 4(b) is a plan view.

FIG. 5 is a pair of views showing a substrate 20, wherein FIG. 5(a) is an elevational view, and FIG. 5(b) is a sectional view taken along line A-A of FIG. 5(a).

FIG. 6(a) is an elevational view showing a substrate 20a, and FIG. 6(b) is an elevational view showing a substrate 20b.

FIG. 7(a) is an elevational view showing a substrate 1e, and FIG. 7(b) is an elevational view showing a substrate 20c.

FIG. 8 is a pair of views showing a substrate 30, wherein FIG. 8(a) is an elevational view, and FIG. 8(b) is a plan view.

FIG. 9 is a pair of views showing a substrate 40, wherein FIG. 9(a) is an elevational view, and FIG. 9(b) is a plan view.

FIG. 10 is a pair of views showing a substrate 50, wherein FIG. 10(a) is an elevational view, and FIG. 10(b) is a plan view.

FIG. 11 is a pair of views showing a substrate 60, wherein FIG. 11(a) is an elevational view, and FIG. 11(b) is a plan view.

FIG. 12 is a pair of views showing a substrate 70, wherein FIG. 12(a) is an elevational view, and FIG. 12(b) is a plan view.

FIG. 14 is a pair of views showing a substrate 90, wherein FIG. 14(a) is an elevational view, and FIG. 14(b) is a plan view.

FIG. 15(a) is a plan view showing a substrate 90a, and FIG. 15(b) is a plan view showing a substrate 90b.

FIG. 17 is a pair of views showing a substrate 30a, wherein FIG. 17(a) is an elevational view, and FIG. 17(b) is a plan view.

FIG. 18 is a pair of views showing a substrate 30b, wherein FIG. 18(a) is an elevational view, and FIG. 18(b) is a plan view.

FIG. 19 is a pair of views showing a substrate 30c, wherein FIG. 19(a) is an elevational view, and FIG. 19(b) is a plan view.

FIG. 21 is a pair of views showing a substrate 30d, wherein FIG. 21(a) is an elevational view, and FIG. 21(b) is a plan view.

FIG. 22 is a set of views showing states of mounting of surface-mount components according to other embodiments.

MODES FOR CARRYING OUT THE INVENTION

Figure 10:
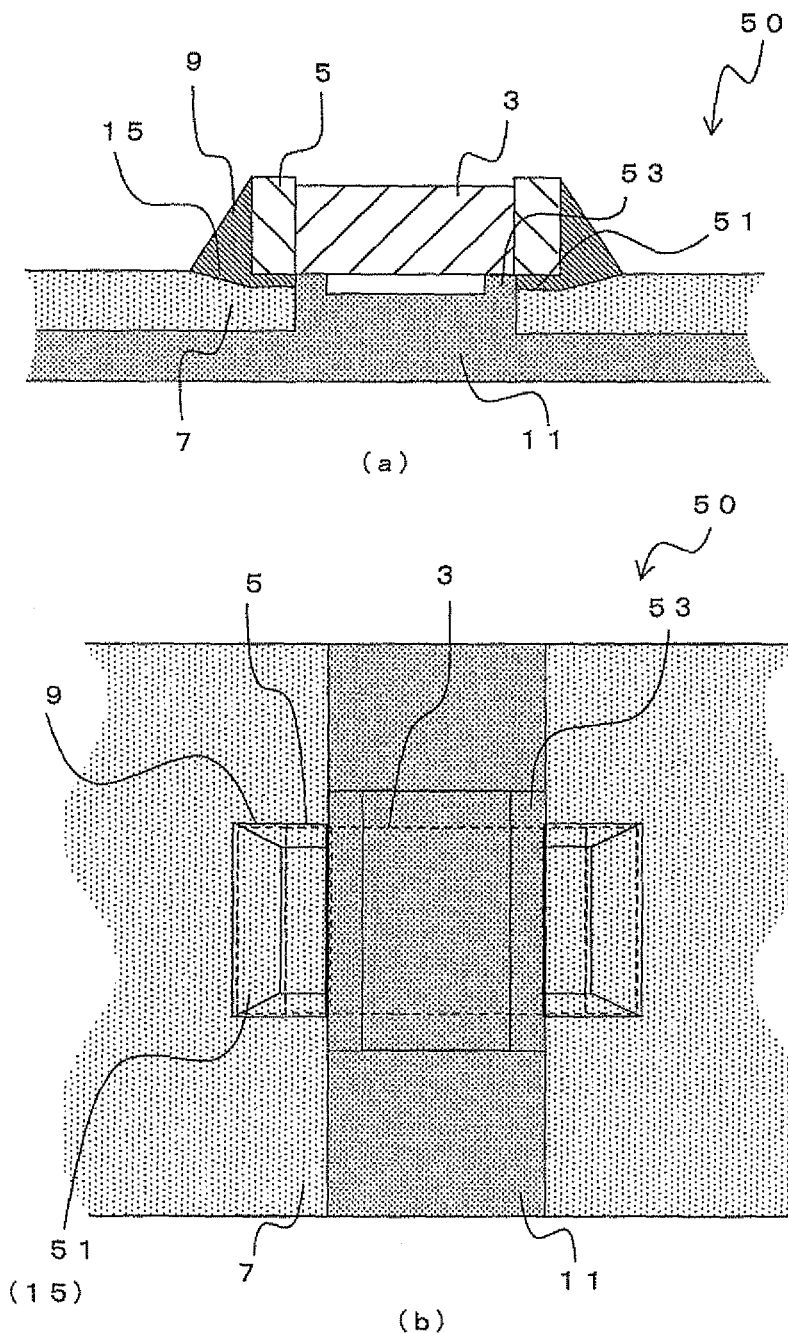

Embodiments of the present invention will next be described with reference to the drawings. FIG. 1 is a pair of views showing a substrate 1, wherein FIG. 1(a) is an elevational view, and FIG. 1(b) is a plan view. FIG. 1(b) is a surface-mount component see-through view showing a surface-mount component 3 in a dotted line (the same also applies to the following drawings).

The substrate 1 includes conductive portions 7 formed by press working or the like and a resin portion 11 integrally injection-molded with the conductive portions 7 and has a thickness of about 3 mm to 10 mm. The conductive portions 7 each have a thickness of about 1 mm and is formed from, for example, a copper alloy. The resin portion 11 is formed from, for example, PPS. The following description refers to an example in which the conductive portions 7 are formed on the resin portion 11; however, needless to say, the present invention can be applied to a substrate in which the conductive portions 7 and the resin portions 11 are formed in a plurality of layers.

A surface-mount component 3, which is an electronic surface-mount component, is mounted on the substrate 1. The surface-mount component 3 has electrodes 5 formed at its opposite sides, and the electrodes 5 and the respective conductive portions 7 are electrically connected by means of a solder 9. That is, the substrate 1 has the conductive portions 7 formed thereon in regions corresponding to the two electrodes 5 of the surface-mount component 3, and the electrodes 5 are connected to the corresponding conductive portions 7. In the following description, regions of the conductive portions 7 where the electrodes 5 are connected to the conductive portions 7 by means of the solder 9 are referred to as connection portions 15. Since direct electrical continuity is not established between the two connection portions 15, the resin portion 11 is formed between the two connection portions 15, thereby isolating the two connection portions 15 from each other. That is, the resin portion 11 extends through the substrate 1 in a region between the two connection portions 15 under the surface-mount component 3.

The substrate 1 has a hole 13 formed in the resin portion 11 (a portion extending therethrough) between the connection portions 15 under the surface-mount component 3. The hole 13 is a recess from the back side or the front side for reducing the thickness of the resin portion 11. The hole 13 has a length equal to or greater than at least the width of the surface-mount component 3 (the length of connection by the solder 9). The hole 13 functions as a stress relaxation mechanism for relaxing stress to be applied to the solder 9 at a high temperature. In the case where a plurality of the surface-mount components 3 are mounted on the substrate 1, the above-mentioned stress relaxation mechanism may be provided in each of the mounting regions for the surface-mount components 3.

Since the substrate 1 has the hole 13 under the surface-mount component 3, when force is applied in such a direction as to increase the distance between the two connection portions 15 as a result of expansion of the resin portion 11 at a high temperature, the hole 13 can absorb the deformation of the expanding resin portion 11. Thus, it becomes possible to reduce force which attempts to increase the distance between the connection portions 15. Also, the formation of the hole 13 can reduce the amount of resin under the surface-mount component 3. Therefore, the amount of expansion of the resin portion 11 can be reduced.

FIG. 2 is a pair of views showing a substrate 1a, which is a modification of the substrate 1. The substrate 1a is substantially similar to the substrate 1, but differs in that resin-exposed portions 14 are formed.

The resin-exposed portions 14 are formed on respective opposite sides of the surface-mount component 3 (externally of the respective electrodes 5 of the surface-mount component 3 and externally of the respective connection portions 15 with respect to the surface-mount component 3). The resin-exposed portions 14 are where the resin portion 11 at the lower side of the substrate 1 is exposed at the upper side (at the side where the surface-mount component 3 is mounted) of the substrate 1; for example, as illustrated, at the resin-exposed portions 14, the resin portion 11 extends through the substrate 1. That is, at the positions of the resin-exposed portions 14, the conductive portions 7 are not exposed at the upper surface of the substrate 1. The resin-exposed portions 14 have a length equal to or greater than at least the width of the surface-mount component 3 (the length of connection by the solder 9).

The above-mentioned hole 13 and the resin-exposed portions 14 collectively function as a stress relaxation mechanism for relaxing stress to be applied to the solder 9 at a high temperature. The resin-exposed portions 14 are formed such that holes 14a formed in the respective conductive portions 7 are filled with resin 11. That is, the holes 14a (deeper than the thickness of the conductive portions 7) are formed in the respective conductive portions 7 located externally of the connection portions 15 in FIG. 1, and the holes 14a are filled with the resin 11 such that the resin 11 in the holes 14a is integrated with the resin 11 in other regions.

The substrate 1a can yield the same effect as that yielded by the substrate 1. Also, the resin-exposed portions 14 are formed on respective opposite sides of the surface-mount component 3. Thus, when the resin portion 11 expands at a high temperature, the resin-exposed portions 14 on the opposite sides of the surface-mount component 3 expand, thereby canceling force which attempts to increase the distance between the connection portions 15; therefore, variation in distance between the connection portions 15 can be restrained. Notably, even when the stress relaxation mechanism is merely composed of the resin-exposed portions 14 without provision of the hole 13, the stress relaxation mechanism can yield an expected effect.

FIG. 3 is a pair of views showing another modification of the substrate 1. A substrate 1b shown in FIG. 3(a) is substantially similar to the substrate 1a, but differs in that the holes 14a are formed in place of the resin-exposed portions 14. That is, as mentioned above, the resin-exposed portions 14 are such that the holes 14a formed in the conductive portions 7 are filled with the resin 11; however, the holes 14a may be left intact without being filled with the resin 11.

The substrate 1b can also yield an effect similar to that yielded by the substrate 1a. That is, the holes 14a absorb deformation, thereby functioning as a stress relaxation mechanism. The hole 13 and the holes 14a may be through-holes as shown in FIG. 3(b) or holes having predetermined depths.

FIG. 4 is a pair of views showing a substrate 1d, which is a further modification of the substrate 1, etc., wherein FIG. 4(a) is an elevational view, and FIG. 4(b) is a plan view. The substrate 1d is substantially similar to the substrate 1a, but differs in the form of the holes. The illustrated right-hand hole 14a is a hole having arcuate end portions, rather than a rectangular hole, as viewed in plane. That is, in the present invention, the holes 14a do not necessarily have a rectangular shape. Also, the holes 14a are not formed perpendicularly to the surface of the substrate. That is, the side surfaces of the holes 14a are formed obliquely to the depth direction of the substrate. Also, as viewed in plane, the holes 14a are not necessarily in parallel with or perpendicular to the sides of the substrate (a mounting direction of the surface-mount component 3).

The side surfaces of the holes 14a are not necessarily oblique along the entire perimeters thereof as illustrated, but may be oblique along at least portions of the perimeters. The opposed side surfaces may be formed obliquely in the following manner: as in the case of the illustrated right-hand hole 14a, the opposed side surfaces are formed parallel to each other while the front-side and back-side edges of the hole 14a are laterally shifted from each other. Alternatively, as in the case of the illustrated left-hand hole 14a, the front-side and back-side sizes of the hole 14a may be differed from each other. When the cross-sectional area of the hole 14a is to be varied, desirably, the hole 14a fans out toward the front side.

Also, the hole 13 under the surface-mount component 3 may fan out downward or may assume a like form. In view of restraint of deformation caused by thermal expansion or the like, desirably, the amount of resin in a region under the surface-mount component 3 is reduced. Therefore, in order to ensure insulation of the conductive portions 7 from each other and to reduce the amount of resin, desirably, the hole 13 in the form of a through-hole fans out downward.

The substrate 1d can also yield an effect similar to that yielded by the substrate 1a. That is, the holes 14a absorb deformation, thereby functioning as a stress relaxation mechanism. By virtue of oblique formation of the side surfaces of the holes 14a, the resin which fills the holes 14a exhibits an anchor effect, thereby establishing strong bond between the conductive portions 7 and the resin portion 11. As in the case of the substrate 1d, the stress relaxation mechanism composed of the hole 14a, etc., may be implemented in different forms between the opposite sides of the surface-mount component 3. That is, the stress relaxation mechanisms on the opposite sides of the surface-mount component 3 may be asymmetrical to each other according to a limitation on a substrate shape, a limitation on mounting of a surface-mount component, or a like limitation.

Next, a second embodiment will be described. In the following description, configurational features which yield functions or effects similar to those yielded by the configurational features shown in FIGS. 1 to 4 are denoted by like reference numerals, and repeated description thereof is omitted. FIG. 5 is a pair of views showing a substrate 20 according to the second embodiment, wherein FIG. 5(a) is an elevational view, and FIG. 5(b) is a sectional view taken along line A-A of FIG. 5(a).

The substrate 20 has protrusions 21 protruding upward (toward the surface-mount component) and formed at the resin portion 11 under the surface-mount component 3. The protrusions 21 are formed in a pair, for example, at respective opposite sides of the surface-mount component 3 (on the sides toward the electrodes 5). That is, the protrusions 21 are formed between the two connection portions 15. The surface-mount component 3 is mounted on the protrusions 21. Thus, the surface-mount component 3 is mounted away from the surface of the substrate 20 by the height of the protrusions 21.

As shown in FIG. 5(b), each of the protrusions 21 has guides 23 formed at its opposite sides. The guides 23 protrude from respective opposite side portions of each of the protrusions 21 and have such a guiding function as to dispose the surface-mount component 3 substantially at the center of each of the protrusions 21.

As mentioned above, the surface-mount component 3 is mounted such that the opposite electrodes 5 are connected to the respective conductive portions 7 on the substrate 20 by means of the solder 9. Since the surface-mount component 3 is disposed above the substrate surface, the position of the electrodes 5 is raised accordingly. Therefore, the distance between the electrodes 5 and the corresponding connection portions 15 is increased. Accordingly, the height of the solder 9 is increased, and the volume of the solder 9 is increased.

The protrusions 21, which collectively function as a stress relaxation mechanism provided in the substrate 20 according to the second embodiment, allow the surface-mount component 3 to be mounted above the substrate surface and allow an increase in the distance between the surface-mount component 3 and the substrate surface. Thus, the height of the solder 9 used to join them can be increased, and the volume of the solder 9 can be increased. Therefore, even upon generation of force to expand the distance between the connection portions 15 at a high temperature, by virtue of an increase in the height and volume of the solder 9, stress does not concentrate in the solder 9, whereby the reliability of the solder 9 can be ensured.

FIG. 6 is a pair of views showing a modification of the substrate 20. A substrate 20a shown in FIG. 6(a) is substantially similar to the substrate 20, but differs in that the hole 13, the holes 14a, and the resin-exposed portions 14 are formed. A substrate 20b shown in FIG. 6(b) is such that the holes 14a of the substrate 20a are not filled with resin and are through-holes. That is, the substrate 20 is configurationally combined with the substrates 1, 1a, 1b, 1c, and 1d, whereby the respective effects can be yielded.

The substrates 1a, 1b, 1c, and 1d and the substrates 20a and 20b are such that the holes 14a or the resin-exposed portions 14 are formed externally of the paired connection portions 15, respectively; however, the present invention is not limited thereto.

FIG. 7(a) is a view showing a substrate 1e. The substrate 1e is the substrate 1a modified such that the resin-exposed portion 14 is formed externally of only one of the two connection portions 15. That is, at a peripheral portion of a substrate, the resin-exposed portion 14 and the hole 14a do not need to be formed externally of each of the two connection portions 15, but may be formed externally of one of the two connection portions 15.

FIG. 7(b) is a view showing a substrate 20c. The substrate 20c is the substrate 20a modified such that the resin-exposed portion 14 is formed externally of only one of the two connection portions 15. That is, also in the substrate 20, the resin-exposed portion 14 and the hole 14a do not need to be formed externally of each of the two connection portions 15, but may be formed externally of one of the two connection portions 15.

Next, a third embodiment will be described. FIG. 8 is a pair of views showing a substrate 30 according to the third embodiment, wherein FIG. 8(a) is an elevational view of the substrate 30, and FIG. 8(b) is a plan view of the substrate 30.

The substrate 30 has enclosures 31 provided laterally of the surface-mount component 3 (externally of the respective electrodes 5) and formed in such a manner as to enclose the surface-mount component 3. The enclosures 31 are made of resin and formed in a manner similar to that for forming the resin portion 11. The enclosures 31 may be formed integral with the resin portion 11 at the back side of the substrate 30.

The enclosures 31 are formed while leaving clearances for the solder 9 around the respective electrodes 5. That is, the enclosures 31 enclose the solder 9 which connects the electrodes 5 and the corresponding connection portions 15. Usually, as shown in FIGS. 1 to 7, the thickness of the solder 9 varies substantially rectilinearly from the electrodes 5 toward an externally far side. However, since the enclosures 31 can retain the solder 9, the solder 9 can be formed in a heaped manner (in an upwardly bulged manner). Therefore, even when the volume of the solder 9 is increased, the solder 9 can be reliably retained without flowing out to a peripheral region.

The enclosures 31, which collectively function as a stress relaxation mechanism, provided on the substrate 30 according to the third embodiment can retain the solder 9 in an upwardly bulging manner by causing the solder 9 to change in shape. Thus, the volume of the solder 9 can be increased. Therefore, even upon expansion of the resin portion 11 at a high temperature and associated application of force which attempts to increase the distance between the connection portions 15, by virtue of a large volume of the solder 9, stress does not concentrate in the solder 9, whereby reliability of the solder 9 can be ensured. Also, since the expansion of the enclosures 31 applies force which presses the connection portions 15 from opposite sides, the pressing force cancels the force which attempts to expand the distance between the connection portions 15, so that force to be applied to the solder 9 can be reduced.

Next, a fourth embodiment will be described. FIG. 9 is a pair of views showing a substrate 40 according to the fourth embodiment, wherein FIG. 9(a) is an elevational view of the substrate 40, and FIG. 9(b) is a plan view of the substrate 40.

The substrate 40 has recesses 41 provided in the connection portions 15 of the conductive portions 7 which are connected to the surface-mount component 3. The recesses 41 are recessed from the surface of the substrate (the conductive portions). That is, the solder 9 is provided in the recesses 41 and connects the recesses 41 and the corresponding electrodes 5. The recesses 41 are formed in the upper surfaces of the respective conductive portions 7 while having a width substantially identical to that of the electrodes 5.

In a region under the surface-mount component 3, the resin portion 11 extends through the substrate 40 between the front and back sides of the substrate 40. The recesses 41 are provided at positions located slightly away from the boundaries between the resin portion 11 and the conductors 7 at the upper surface of the substrate 40. That is, at the boundaries between the resin portion 11 and the conductors 7 under the surface-mount component 3, component supports 43 are formed for supporting the surface-mount component 3. Therefore, the component supports 43 are edge portions of the recesses 41 at the conductive portions 7. The upper surfaces of the component supports 43 may be substantially as high as the substrate surface or may be higher than the substrate surface. By means of the upper surfaces of the component supports 43 being higher than the substrate surface, the surface-mount component 3 can be disposed at a height above the substrate.

By virtue of the recesses 41, which collectively function as a stress relaxation mechanism, and the component supports 43 provided in the substrate 40 according to the fourth embodiment, the position of the connection portions 15 can be lowered by the depth of the recesses 41. Accordingly, the height of the solder 9 can be increased. Also, the volume of the solder 9 can be increased. Therefore, even upon generation of force to expand the distance between the connection portions 15 at a high temperature, by virtue of an increase in the height and volume of the solder 9, stress does not concentrate in the solder 9, whereby the reliability of the solder 9 can be ensured. This effect can be further enhanced by means of the component supports 43 raising the mounting position of the surface-mount component 3.

Next, a fifth embodiment will be described. FIG. 10 is a pair of views showing a substrate 50 according to the fifth embodiment, wherein FIG. 10(*a*) is an elevational view of the substrate 50, and FIG. 10(*b*) is a plan view of the substrate 50.

The substrate 50 is configured substantially similar to the substrate 40, but differs in that recesses 51 are formed in place of the recesses 41. The recesses 51 are formed in the respective connection portions 15 while having a width substantially identical to that of the electrodes 5. The recesses 51 are formed in such a manner as to adjoin the resin portion 11. In the substrate 50, portions of the resin portion 11 (portions in the vicinity of boundaries with the recesses 51) under the surface-mount component 3 function as component supports 53. Therefore, the surface-mount component 3 is supported by the component supports 53. Similar to the component supports 43, the upper surfaces of the component supports 53 may be substantially as high as the substrate surface or may be higher than the substrate surface.

By virtue of the recesses 51, which collectively function as a stress relaxation mechanism, and the component supports 53 provided in the substrate 50 according to the fifth embodiment, the position of the connection portions 15 can be lowered by the depth of the recesses 51; accordingly, the height of the solder 9 can be increased, and the volume of the solder 9 can be increased. Therefore, even upon generation of force to expand the distance between the connection portions 15 at a high temperature, by virtue of an increase in the height and volume of the solder 9, stress does not concentrate in the solder 9, whereby the reliability of the solder 9 can be ensured. This effect can be further enhanced by means of the component supports 53 raising the mounting position of the surface-mount component 3.

Next, a sixth embodiment will be described. FIG. 11 is a pair of views showing a substrate 60 according to the sixth embodiment, wherein FIG. 11(*a*) is an elevational view of the substrate 60, and FIG. 11(*b*) is a plan view of the substrate 60.

The substrate 60 has conductive projections 61 of the conductive portions 7 which project toward a position corresponding to the center of the surface-mount component 3 (in directions along which the conductive portions 7 approach each other) in a region under the surface-mount component 3 between the connection portions 15. That is, the conductive portions 7 reduce the width of the resin portion 11 which extends through the substrate under the surface-mount component 3. A resin coating 63 is formed on the upper surfaces of the conductive portions 7 under the surface-mount component 3. The resin coating 63 is formed between the two connection portions 15 at least in the region under the surface-mount component 3.

The surface-mount component 3 is disposed on the resin coating 63. Therefore, the surface-mount component 3 is disposed at a level which is higher than the substrate surface by the thickness of the resin coating 63.

By virtue of the conductive projections 61 and the resin coating 63, which collectively function as a stress relaxation mechanism, provided in the substrate 60 according to the sixth embodiment, the amount of resin of the resin portion 11 under the surface-mount component 3 can be reduced. Thus, the amount of expansion of the resin portion 11 under the surface-mount component 3 can be reduced. Therefore, force which attempts to expand the distance between the connection portions 15 can be reduced. Provision of the resin coating 63 prevents the establishment of electrical continuity between the conductive portions 7 which could otherwise result from the solder 9 sneaking under the surface-mount component 3 in soldering the surface-mount component 3. Furthermore, since the thickness of the resin coating 63 increases the height of the solder 9, the volume of the solder 9 can be increased. Therefore, even upon expansion of the resin portion 11 at a high temperature and associated application of force which attempts to increase the distance between the connection portions 15, by virtue of the increase in the height and volume of the solder 9, stress does not concentrate in the solder 9, whereby reliability of the solder 9 can be ensured.

Next, a seventh embodiment will be described. FIG. 12 is a pair of views showing a substrate 70 according to the seventh embodiment, wherein FIG. 12(*a*) is an elevational view of the substrate 70, and FIG. 12(*b*) is a plan view of the substrate 70.

The substrate 70 is substantially similar to the substrate 60, but differs in that each of the conductive projections 61 has a stepped portion 71, which is a level difference, on the upper surface of its end portion. The stepped portions 71 are where the conductive portions 7 are reduced in thickness in a region under the surface-mount component 3. A resin coating 73 having a thickness corresponding to the step level of the stepped portions 71 is formed on the stepped portions 71 (under the surface-mount component 3). That is, the upper surface of the resin coating 73 is substantially flush with the upper surface of the substrate 70.

By virtue of the conductive projections 61, the stepped portions 71, and the resin coating 73, which collectively function as a stress relaxation mechanism, provided in the substrate 70 according to the seventh embodiment, the amount of resin of the resin portion 11 under the surface-mount component 3 can be reduced; thus, the amount of expansion of the resin portion 11 under the surface-mount component 3 can be reduced. Therefore, force which attempts to expand the distance between the connection portions 15 can be reduced. Also, since the upper surface of the resin coating 73 is substantially flush with the substrate surface, in soldering the surface-mount component 3, the solder 9 is unlikely to sneak under the surface-mount component 3. Even when the solder 9 somewhat sneaks under the surface-mount component 3, there can be prevented the establishment of electrical continuity between the conductive portions 7 which could otherwise be caused by the sneaking solder 9.

Figure 13:
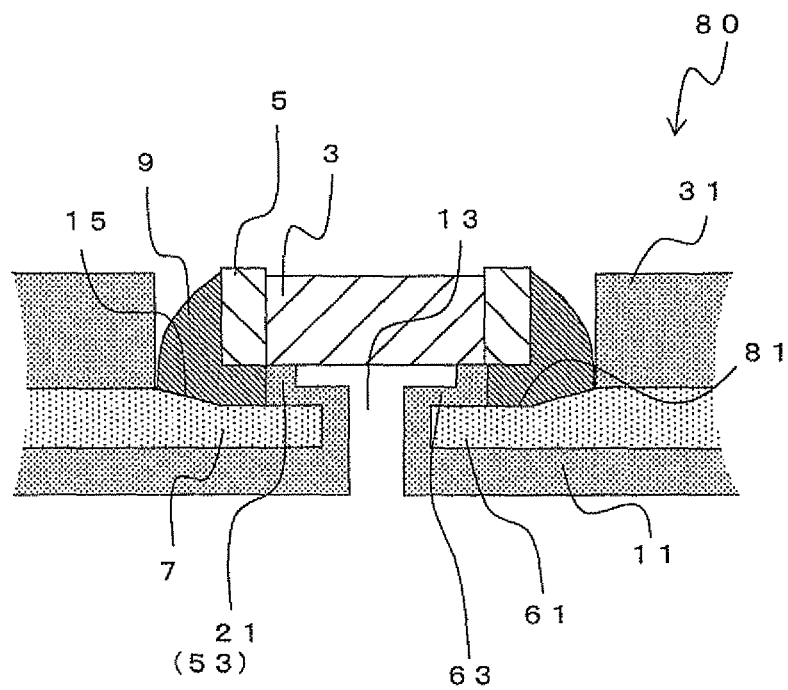
FIG. 13 is an elevational view showing a substrate 80.

The above-mentioned configurational features may be combined in an arbitrary way. For example, FIG. 13 is a view showing a substrate 80 in which the above-mentioned configurational features are combined.

The substrate 80 has the hole 13 formed under the surface-mount component 3, and the conductive projections 61 formed on the respective opposite sides of the hole 13. The resin coating 63 is formed on the upper surfaces of the conductive projections 61, and the protrusions 21 (or the component supports 53) are formed on the resin coating 63 and support the surface-mount component 3. The surface-mount component 3 is connected by the solder 9 which fills recesses 81 formed in the conductive portions 7. Furthermore, the enclosures 31 are formed laterally of the surface-mount component 3.

As in the case of the substrate 80, the configurational features of the stress relaxation mechanisms of the above-described embodiments can be implemented in a combined manner. A combination of the configurational features of the stress relaxation mechanisms is not limited to the example shown in FIG. 13, but the configurational features shown in FIGS. 1 to 12 may be implemented singly or in combination.

Next, an eighth embodiment will be described. FIG. 14 is a pair of views showing a substrate 90 according to the eighth embodiment, wherein FIG. 14(a) is an elevational view of the substrate 90, and FIG. 14(b) is a plan view of the substrate 90.

The substrate 90 is configured, for example, as follows: in the configuration of the substrate 1, the holes 14a are formed in such a manner as to enclose the respective connection portions 15, which are located at opposite sides of the surface-mount component 3, from three directions. That is, the holes 14a around the respective connection portions 15 communicate with each other via the hole 13. In this case, desirably, the holes 14a are through-holes as illustrated.

Each of the connection portions 15 is enclosed by the corresponding hole 14a from three directions and thus assumes the form of an island which is connected only at a portion to the substrate body. A connecting portion between the substrate body and the island (a portion including the corresponding connection 15) is a deformable portion 91. The deformable portion 91 is narrower and thus weaker in strength than the other portion of the substrate body. Therefore, the deformable portions 91 are more deformable than other portions.

That is, deformations of the resin portion 11 and the conductive portions 7 associated with thermal expansion or the like are absorbed through elastic deformations or the like of the deformable portions 91. Therefore, stresses associated with the thermal-expansion-induced deformations are not directly applied to the solder 9 at the connection portions 15. The deformable portions 91 corresponding to the connection portions 15 may be formed in mutually opposite directions relative to the substrate as illustrated or may be formed in the same direction.

The form of the deformable portion is not limited to the example shown in FIG. 14. For example, the deformable portion may be that of a substrate 90a shown in FIG. 15(a). The substrate 90a has deformable portions 91a in the form of a circuit, and the substrate body and the connection portions 15 are connected via the respective deformable portions 91a. The deformable portions 91a have a large deformable area and are elastically deformable in a plurality of directions; therefore, the deformable portions 91a can absorb thermal-expansion-induced deformations or the like in a plurality of directions. That is, direct application of stress associated with thermal-expansion-induced deformations to the solder 9 can be efficiently prevented.

Also, a substrate 90b shown in FIG. 15(b) may be used. The substrate 90b has deformable portions 91b in the form of a loop. That is, the shape of the deformable portion is not limited to the illustrated examples, but portions which are deformable relative to the substrate body may be formed such that the connection portions 15 are disposed via the portions.

Figure 16:
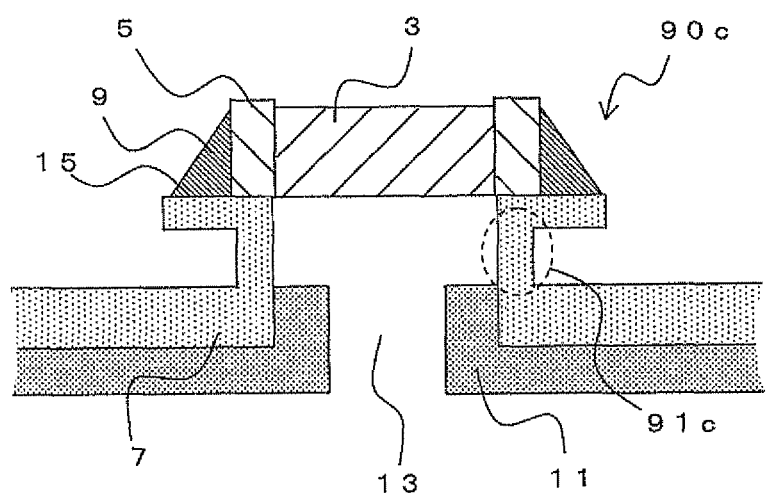
FIG. 16 is an elevational view showing a substrate 90c.

For example, as in the case of a substrate 90c shown in FIG. 16, deformable portions 91c may be formed perpendicular to the substrate surface. That is, portions weaker in strength than the substrate body are intentionally formed, thereby forming the portions which are more deformable than the substrate body. Thus, when a thermal-expansion-induced deformation arises, the deformable portions can be elastically deformed in a preferential manner. Therefore, stress to be applied to the solder 9 can be absorbed through deformation of the deformable portions.

When enclosures are to be formed as in the case of FIG. 8 (the substrate 30), a substrate 30a shown in FIG. 17 may be used.

Enclosures 31a are formed laterally of the surface-mount component 3 (externally of the respective electrodes 5) in such a manner as to enclose the surface-mount component 3 (the solder 9). The enclosures 31a are made of resin and formed through injection molding in a manner similar to that for forming the resin portion 11. Each of the enclosures 31a is formed in such a manner as to enclose the surface-mount component 3 (each of the electrodes 5) from three directions. The enclosures 31a cover the conductive portions 7 of the substrate. The enclosures 31a may be formed integral with the resin portion 11 at the back side of the substrate 30a. Desirably, the enclosures 31a enclose the entire electrodes 5 and the entire solder 9; however, the enclosures 31a may be provided externally of only the solder 9 excluding side portions of the electrodes 5. The enclosures 31a can confine the solder 9 (the connection portions 15) to a predetermined range of provision.

The enclosures 31a have such a taper shape as to become more distant from the surface-mount component while moving upward (when a side toward the substrate is the lower side). That is, each of the enclosures 31a has a cutout shape such that as viewed on its section, the enclosing range expands while moving upward. Such cutout portions of the enclosures 31a are solder view portions 32 which allow visual inspection, from outside, of the condition of connection of the solder 9. By virtue of the solder view portions 32, lower portions of the solder 9 (portions in the vicinity of the connection portions 15) are readily visible from outside without contact with the solder 9. The angle of the taper may be, for example, about 45 degrees.

The thickness of the enclosures 31a is determined according to workability in injection molding and the strength of the substrate, but is, for example, substantially identical to the thickness of the electrodes 5 of the surface-mount component.

The solder view portions 32 may have a rectilinear taper as illustrated, or an arcuate taper. No particular limitation is imposed on the taper shape so long as enclosing fields of the enclosures 31a around the surface-mount component 3 continuously fan out.

According to the substrate 30a, the enclosures 31a can reliably confine the solder 9 to a predetermined range of provision. Thus, the solder 9 does not flow out to a peripheral region. Also, by virtue of the solder view portions 32, the condition of the solder is visible from outside. Therefore, the shape of fillet of solder, a soldering defect, etc., can be visually inspected in a reliable manner.

A substrate 30b shown in FIG. 18 has enclosures 31b in place of the enclosures 31a of the substrate 30a. Each of the enclosures 31b has a stepped shape such that steps are formed upward from the lower side (a side toward the surface of contact with the substrate) while becoming more distant from the surface-mount component.

In the substrate 30b, the second and higher steps of the enclosures 31b including the upper surfaces of the bottom steps serve as the solder view portions 32. Therefore, the enclosures 31b reliably confine the solder 9 to a predetermined range of provision, and by virtue of the solder view portions 32 formed by the second and higher steps, lower portions of the solder 9 (portions in the vicinity of the connection portions 15) are readily visible from outside.

The solder view portion may assume a combined form of a taper shape and a stepped shape.

A substrate 30c shown in FIG. 19 has enclosures 31c in place of the enclosures 31a of the substrate 30a. The enclosures 31c have respective solder retaining portions 34 provided under the solder view portions 32.

Figure 20:
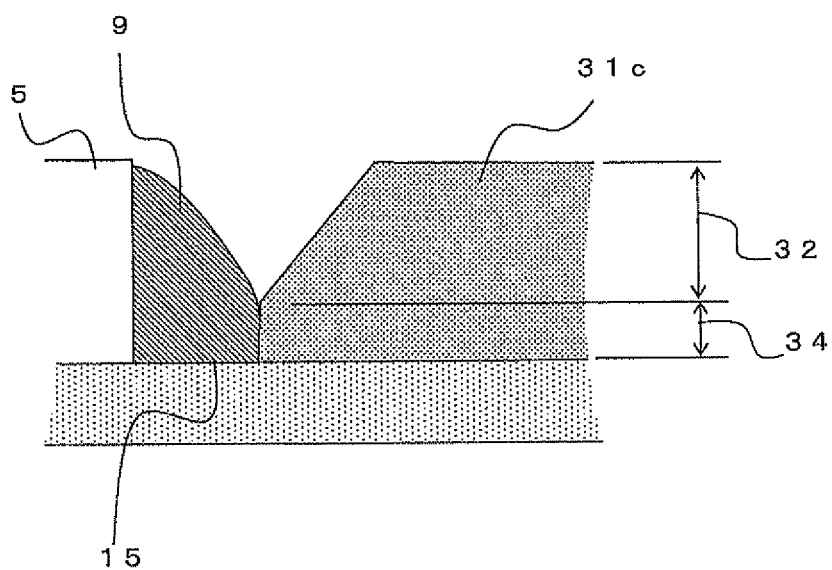
FIG. 20 is an enlarged view showing an area A, in the vicinity of an enclosure 31c, of FIG. 19.

FIG. 20 is an enlarged view of an area A of FIG. 19, showing the shape of the enclosure 31c. A lower portion (in the vicinity of an end on a side toward the substrate) of the inner peripheral surface (on a side toward the surface-mount component) of the enclosure 31c is the solder retaining portion 34, and the solder view portion 32 is formed above the solder retaining portion 34.

The solder retaining portions 34 are formed substantially perpendicular to the surface of the substrate (the surfaces of the connection portions 15). It is good practice for the solder retaining portions 34 to have a thickness of, for example, about one-third of the overall thickness of the enclosures 31c. This is because a greater thickness lessens the effect of the solder view portions 32. The solder retaining portions 34 are in contact with the solder 9 for preventing the solder 9 from flowing out to a peripheral region and for confining the solder 9 to a predetermined range of provision. Also, as a result of the solder retaining portions 34 retaining the solder, the fillet shape of the solder can be controlled. That is, the fillet shape can be easily controlled so as to bulge upward as needed or so as not to bulge.

That is, through employment of the solder retaining portions 34, the fillet of the solder 9 can be mounded (bulged upward) as illustrated, and even when the volume of the solder 9 is increased, the solder 9 can be reliably retained without flowing out to a peripheral region.

According to the substrate 30c, by virtue of the solder retaining portions 34, the range of provision of the solder 9 can be confined, and the fillet shape of the solder 9 can be controlled.

A substrate 30d shown in FIG. 21 has enclosures 31d in place of the enclosures 31a of the substrate 30a. The enclosures 31d have the respective solder retaining portions 34 under the solder view portions 32. That is, the inner peripheral surfaces (substantially perpendicular to the substrate surface) of the bottom steps (closest to the substrate) of the stepped enclosures 31d are the solder retaining portions 34.

According to the substrate 30d, by virtue of the solder retaining portions 34, the range of provision of the solder 9 can be confined, and the fillet shape of the solder 9 can be improved.

As shown in FIG. 22(a), the above-mentioned configurational features can be applied to a 3-terminal (3-electrode) surface-mount component 3a like a diode. In this case, the electrodes 5 are connected to the connection portions 15 of the conductive portions by means of the solder 9. In this case, the solder view portions 32 may be formed in such a manner as to enclose the respective solders 9 (electrodes 5). By means of the solder view portions 32 being formed individually for the electrodes, the range of application of the solder 9, which is a bonding member for each of the electrodes 5, can be confined, and a portion of the solder 9 in the vicinity of a corresponding connection portion is readily visible.

Similarly, as shown in FIG. 22(b), the above-mentioned configurational features can also be applied to a 3-terminal (3-electrode) surface-mount component 3b like a field-effect transistor. Even in the case of a surface-mount component having different terminal shapes (electrode shapes), such as the surface-mount component 3b, the solder view portions 32 may be formed in such a manner as to enclose the respective electrodes 5 (solders 9).

Furthermore, as shown in FIG. 22(c), the above-mentioned configurational features can also be applied to a 6-terminal (6-electrode) surface-mount component 3c like a transistor. Even in the case of a surface-mount component having three or more terminals (electrodes), such as the surface-mount component 3c, the solder view portions 32 may be formed in such a manner as to enclose the respective electrodes 5 (solders 9).

While the embodiments of the present invention have been described with reference to the appended drawings, the technical scope of the present invention is not limited to the embodiments. It is apparent that those skilled in the art can easily arrive at various variations or modifications without departing from technical ideas described in claims, and these variations or modifications are to be construed as belonging to the technical scope of the present invention.

DESCRIPTION OF REFERENCE NUMERALS 1, 1a, 1b, 1c, 1d, 1e, 20, 20a, 20b, 20c, 30, 30a, 30b, 30c, 30d, 40, 50, 60, 70, 80, 90, 90a, 90b, 90c: substrate
3: surface-mount component
5: electrode
7: conductive portion
9: solder
11: resin portion
13: hole
14a: hole
14: resin-exposed portion
15: connection
21: protrusion
23: guide
31, 31a, 31b, 31c, 31d: enclosure
32: solder view portion
34: solder retaining portion
61: conductive projection
63, 73: resin coating
71: stepped portion
41, 81: recess
43, 53: component support
91, 91a, 91b, 91c: deformable portion

The invention claimed is:
1. A mounting structure comprising:
an injection molded substrate including a resin portion and conductive portions exposed at portions of a surface of the substrate;
a surface-mount component positioned on the substrate, and opposite side portions of the surface-mount component are connected to a pair of the respective conductive portions of the substrate at respective connection portions by solder; and
a stress relaxation mechanism provided at least under the surface-mount component and being configured to relax stress applied to the solder in response to thermal expansion of the resin portion, the stress relaxation mechanism including: (i) a first hole provided between the connection portions under the surface-mount component, and (ii) a second hole formed in the corresponding conductive portion at a position located laterally of at least one of the connection portions, wherein the first hole and/or the second hole is a through-hole extending through the substrate.

2. A mounting structure comprising:

an injection molded substrate including a resin portion and conductive portions exposed at portions of a surface of the substrate;

a surface-mount component positioned on the substrate, and opposite side portions of the surface-mount component are connected to a pair of the respective conductive portions of the substrate at respective connection portions by solder; and a stress relaxation mechanism provided at least under the surface-mount component and being configured to relax stress applied to the solder in response to thermal expansion of the resin portion, the stress relaxation mechanism including: (i) a first hole provided between the connection portions under the surface-mount component, and (ii) a second hole formed in the corresponding conductive portion at a position located laterally of at least one of the connection portions, wherein at least a portion of a side surface of the first hole and/or the second hole is formed obliquely, relative to the substrate.

3. A mounting structure comprising:

an injection molded substrate including a resin portion and conductive portions exposed at portions of a surface of the substrate, a surface-mount component positioned on the substrate, and opposite side portions of the surface-mount component are connected to a pair of the respective conductive portions of the substrate at respective connection portions by solder; and a stress relaxation mechanism provided at least under the surface-mount component and being configured to relax stress applied to the solder in response to thermal expansion of the resin portion, the stress relaxation mechanism includes: (i) projections of the conductive portions, the projections being configured to project toward a position corresponding to the center of the surface-mount component in a region under the surface-mount component between the connection portions of the surface-mount component and the conductive portions, and (ii) a resin coating which covers upper surfaces of the projections, and is formed at least in a region under the surface-mount component.

4. The mounting structure according to claim 3, wherein the projections have respective stepped portions formed in the conductive portions, and the resin coating covers the stepped portions.

5. A mounting structure comprising:

an injection molded substrate including a resin portion and conductive portions exposed at portions of a surface of the substrate;

a surface-mount component positioned on the substrate, and opposite side portions of the surface-mount component are connected to a pair of the respective conductive portions of the substrate at respective connection portions by solder; and a stress relaxation mechanism provided at least partially under or around the solder and being configured to relax stress applied to the solder in response to thermal expansion of the resin portion, wherein:

the stress relaxation mechanism includes protrusions provided between the connection portions under the surface-mount component;

the surface-mount component is disposed on the protrusions; and the surface-mount component is disposed at a height higher than a surface of the substrate.

6. A mounting structure comprising:

an infection molded substrate including a resin portion and conductive portions exposed at portions of a surface of the substrate:

a surface-mount component positioned on the substrate, and opposite side portions of the surface-mount component are connected to a pair of the respective conductive portions of the substrate at respective connection portions by solder; and a stress relaxation mechanism provided at least partially under or around the solder and being configured to relax stress applied to the solder in response to thermal expansion of the resin portion, wherein:

the stress relaxation mechanism includes enclosures made of resin and provided laterally of the respective connection portions, and the solder is applied in spaces between the surface-mount component and the enclosures.

7. The mounting according to claim 6, wherein:

each enclosure has a solder view portion formed such that the distance between the enclosure and the surface-mount component increases with the distance from the surface of the substrate, and in a state in which the solder is applied in the spaces between the surface-mount component and the enclosures, a condition of the solder in the vicinity of the connection portions is visible from outside.

8. The mounting structure according to claim 7, wherein at least a portion of each solder view portion has a taper shape such that the distance between the enclosure and the surface-mount component increases with the distance from the surface of the substrate.

9. The mounting structure according to claim 7, wherein at least a portion of each solder view portion has a stepped shape such that the distance between the enclosure and the surface-mount component increases with the distance from the surface of the substrate.

10. The mounting structure according to claim 7, wherein a solder retaining portion substantially perpendicular to the surface of the substrate is formed below each of the solder view portions.

\* \* \* \* \*